United States Patent
Wada

(10) Patent No.: US 9,477,124 B2
(45) Date of Patent: Oct. 25, 2016

(54) DISPLAY DEVICE AND TELEVISION DEVICE

(71) Applicant: Sharp Kabushiki Kaisha, Osaka-shi, Osaka (JP)

(72) Inventor: Takeshi Wada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/422,411

(22) PCT Filed: Sep. 2, 2013

(86) PCT No.: PCT/JP2013/073508
§ 371 (c)(1),
(2) Date: Feb. 19, 2015

(87) PCT Pub. No.: WO2014/038503
PCT Pub. Date: Mar. 13, 2014

(65) Prior Publication Data
US 2015/0212359 A1    Jul. 30, 2015

(30) Foreign Application Priority Data
Sep. 6, 2012  (JP) .................. 2012-196050

(51) Int. Cl.
*G02F 1/1333* (2006.01)
*G02F 1/1345* (2006.01)
(Continued)

(52) U.S. Cl.
CPC ......... *G02F 1/13452* (2013.01); *G02B 6/0091* (2013.01); *G02F 1/133308* (2013.01);
(Continued)

(58) Field of Classification Search
CPC ............ G02F 1/13452; G02F 1/133308; G02F 1/133382; G02F 1/133385; G02F 1/133602; G02F 1/133615; G02F 2001/133317; G02F 2001/13332; G02F 2001/133328; G02F 2001/133607; G02F 2001/133614; G02F 1/1601; G02F 1/20; G02F 1/206; G02B 6/0091; G02B 6/009; H05K 5/0017; H05K 5/0026; H05K 5/0039; H05K 5/0047; H05K 5/0052; H05K 7/20; H05K 7/2039; H05K 7/20436; H05K 7/20509; H05K 7/20518; H05K 7/20954; H05K 7/20963; H05K 5/04; H05K 5/00407; G06F 1/1601; G06F 1/20; G06F 1/206

USPC ...... 349/58, 61, 65, 150, 151; 361/749, 752; 362/600, 612, 630, 632, 633, 362/97.1–97.3
See application file for complete search history.

(56) References Cited

U.S. PATENT DOCUMENTS 7,839,396 B2 * 11/2010 Yang .................. G02F 1/13452
345/204
2008/0018626 A1    1/2008 Yang et al.
(Continued)

FOREIGN PATENT DOCUMENTS

| JP | 2004-294785 A | 10/2004 |
|---|---|---|
| JP | 2008-026866 A | 2/2008 |
| JP | 2008-304913 A | 12/2008 |

OTHER PUBLICATIONS

Official Communication issued in International Patent Application No. PCT/JP2013/073508, mailed on Oct. 1, 2013.

*Primary Examiner* — Paisley L Arendt
*Assistant Examiner* — Angela Davison
(74) *Attorney, Agent, or Firm* — Keating & Bennett, LLP

(57) ABSTRACT

A display device includes a display panel, a flexible circuit board, a signal transmission board, a driver component, a frame-shaped member, and a heat dissipation member. The signal transmission board is configured to transmit signals to the flexible circuit board. The driver component is mounted on the flexible circuit board and configured to process the signals from the signal transmission board and supply the processed signals to the display panel. The frame-shaped member retains the liquid crystal panel by holding edges of the display panel on a display surface side. The heat dissipation member has higher thermal conductivity than the frame-shaped member and embedded in a portion of the frame-shaped member. The heat dissipation member includes a contact portion that projects toward the signal transmission board and a distal end that is in contact with a portion of the flexible circuit board on which the driver component is mounted.

14 Claims, 15 Drawing Sheets

(51) Int. Cl.
*H05K 7/20* (2006.01)
*F21V 8/00* (2006.01)
*G02F 1/1335* (2006.01)

(52) U.S. Cl.
CPC ... *G02F1/133382* (2013.01); *G02F 1/133385* (2013.01); *G02F 2001/13332* (2013.01); *G02F 2001/133317* (2013.01); *G02F 2001/133328* (2013.01); *G02F 2001/133607* (2013.01); *H05K 7/20954* (2013.01)

(56) References Cited

U.S. PATENT DOCUMENTS

| | | | | |
|---|---|---|---|---|
| 2008/0297681 | A1* | 12/2008 | Yang | G02F 1/133308 349/58 |
| 2009/0067112 | A1* | 3/2009 | Takabayashi | G02F 1/13452 361/220 |
| 2012/0075268 | A1* | 3/2012 | Chung | G02F 1/13452 345/204 |

* cited by examiner

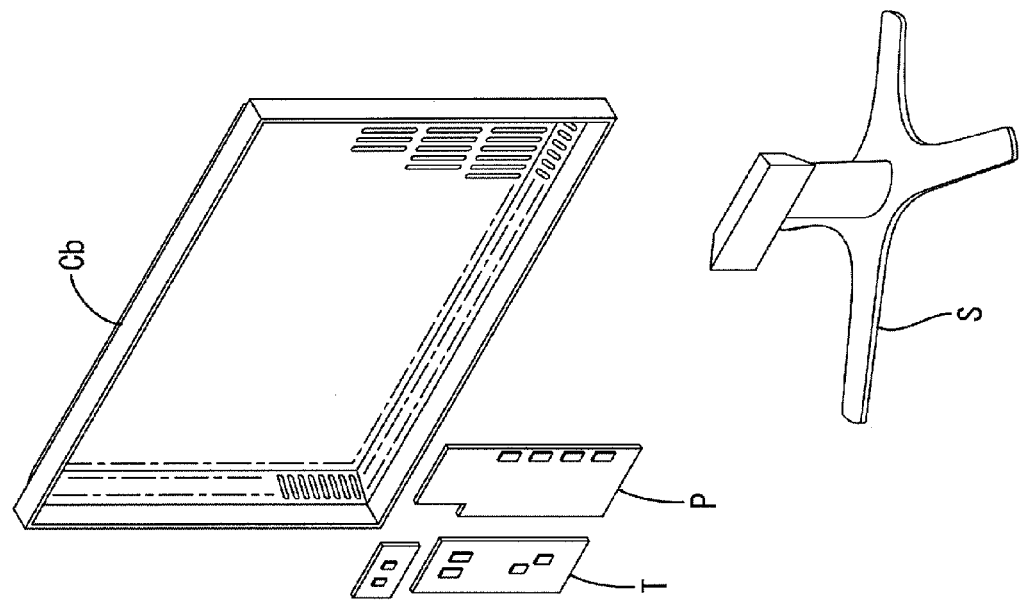
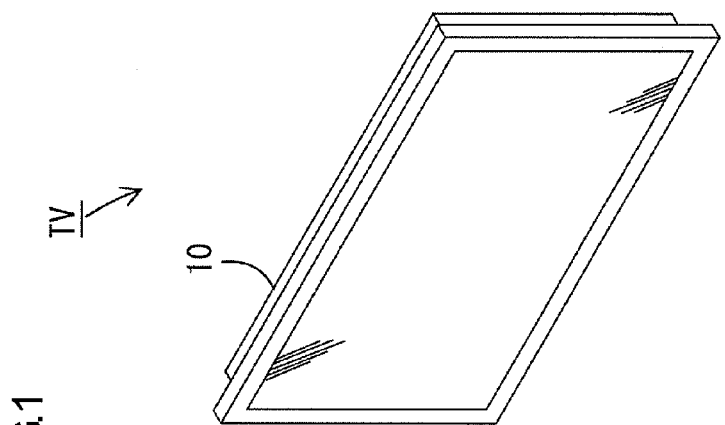
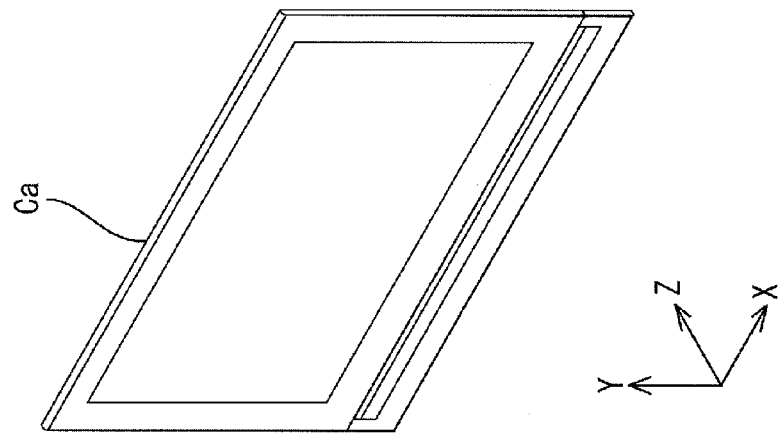
FIG.1

DISPLAY DEVICE AND TELEVISION DEVICE

TECHNICAL FIELD

The present invention relates to a display device and a television device.

BACKGROUND ART

One end of a tape carrier package (TCP) on which a driver for driving liquid crystals is mounted is connected to a liquid crystal panel in a liquid crystal display device, which may be used for a liquid crystal television device. When signals are transmitted from a printed circuit board connected to another end of the TCP, the driver processes the signals and supplies driving signals to the liquid crystal panel. As a result, driving of the liquid crystal panel is controlled. Such a liquid crystal display device is disclosed in Patent Document 1

RELATED ART DOCUMENT

Patent Document

Patent Document 1: Japanese Unexamined Patent Application Publication No. 2008-304913

Problem to be Solved by the Invention

The liquid crystal display device disclosed in Patent Document 1 includes a bezel for holding a liquid crystal panel from the front. The bezel includes multiple components connected to one another. One of the components of the bezel is made of material having high thermal conductivity. The component includes a groove that is recessed toward the rear of the bezel. The bottom of the groove is in contact of a TCP that is connected to the liquid crystal panel. This configuration is considered to dissipate heat from the TCP to the bezel. However, the bezel having such a configuration requires multiple components and this increases a parts cost. Furthermore, an extra step is required for connecting the components in the manufacturing process.

DISCLOSURE OF THE PRESENT INVENTION

A technology disclosed herein was made in view of the above circumstances. An object is to provide technology for suppressing heat from components for driving a display panel.

Means for Solving the Problem

A technology disclosed herein relates to a display device including a display panel, a flexible circuit board, a signal transmission circuit, a driver component, a frame-shaped member, and a heat dissipation member. The flexible circuit board has flexibility and includes an end connected to the display panel. The signal transmission circuit is connected to another end of the flexible circuit board and configured to transmit signals to the flexible circuit board. The driver component is mounted on the flexible circuit board and configured to process the signals from the signal transmission board and supply the processed signals to the display panel to drive the display panel. The frame-shaped member has a frame-like shape and retains the liquid crystal panel by holding edges of the display panel on a display surface side. The heat dissipation member has higher thermal conductivity than the frame-shaped member and embedded in a portion of the frame-shaped member. The heat dissipation member includes a contact portion that projects toward the signal transmission board and a distal end that is in contact with a portion of the signal transmission board on which the driver component is mounted.

According to the display device, even if heat is present around the driver component during driving of the driver component, the heat is effectively dissipated to the outside of the display device. This is because a portion in which the heat is present (the portion on which the driver component is mounted) is in contact with the contact portion of the heat dissipation member that has higher thermal conductivity than the frame-shaped member. Therefore, a temperature increase in the driver component is effectively suppressed. Furthermore, the heat dissipation member is embedded in the portion of the frame-shaped member and portions of the frame-shaped member other than the portion in which the heat dissipation member is embedded are integrally formed. According to this configuration, the number of components can be reduced because it is not necessary to use a frame-shaped member including multiple components that are connected or welded together. In the above-described display device, the temperature increase in the driver component for driving the display panel is suppressed while the number of components is maintained small.

The frame-shaped member may include a top section parallel to a display surface of the display panel and a side section that extends from an outer edge of the top section so as not to be parallel to the top section. The heat dissipation member may include a portion including the contact portion is embedded in a portion of the side section.

According to this configuration, the contact portion is provided so as to project toward a side of the display panel other than the display surface side. With this configuration, when heat produced by the driver component is dissipated via the contact portion, the heat is less likely to affect the display panel.

The heat dissipation member may be embedded in the frame-shaped member with an edge portion of the heat dissipation member engaged with the portion of the frame-shaped member.

According to this configuration, because the heat dissipation member is engaged with the portion of the frame-shaped member, the heat dissipation member is less likely to come off the frame-shaped member.

The heat dissipation member may be embedded in the frame-shaped member through press-fitting of the heat dissipation member in the portion of the frame-shaped member.

According to this configuration, because the heat dissipation member is press-fitted in the portion of the frame-shaped member, the heat dissipation member is less likely to come off the frame-shaped member.

The heat dissipation member may be embedded in the frame-shaped member through swaging of the heat dissipation member to the portion of the frame-shaped member.

According to this configuration, because the heat dissipation member is swaged to the portion of the frame-shaped member, the heat dissipation member is less likely to come off the frame-shaped member.

The flexible circuit board may include a plurality of flexible boards arranged parallel to and separately from one another and connected to the display panel and the signal transmission board. The heat dissipation member may include a plurality of heat dissipation member embedded in portions of the frame-shaped member corresponding to the flexible circuit boards.

According to this configuration, because the contact portions of the heat dissipation members are in contact with the driver components on the respective flexible circuit boards, heat produced by the driver components are effectively dissipated via the heat dissipation members.

The signal transmission board may be arranged such that a plate surface thereof is perpendicular to the display surface of the display panel. The flexible circuit board may include a bending portion that bends at about a right angle.

According to this configuration, a tension is effectively exerted on the flexible circuit board and the flexible circuit board is under tension. Therefore, the contact portion is stably in contact with the portion of the flexible circuit board on which the driver component is mounted.

The display device may further include a lighting device arranged on an opposite side of the display panel from the display surface and configured to supply illumination light to the display panel. The lighting device may include a light source, a light guide plate, and a chassis. The light guide plate may include an opposed surface that is opposed to the light source and a non-opposed surface that is not opposed to the light source. The light guide plate may be configured to direct light from the light source toward the display panel. The chassis may hold at least the light source and the light guide plate. The signal transmission board may be arranged parallel to the non-opposed surface and such that at least the chassis is between the signal transmission board and the non-opposed surface.

In the lighting device having such a configuration in which the light source is arranged opposite the opposed surface of the light guide plate, the light source is concentrated in the end portion of the lighting device close to the opposed surface. Therefore, a temperature of the end portion tends to increase due to the heat produced by the light source as it is turned on. According to the above configuration, the signal transmission board is arranged parallel to the non-opposed surface and such that at least the chassis is sandwiched between the signal transmission board and the non-opposed surface. Therefore, the signal transmission board is less likely to be subjected to the heat from the light source and thus the heat produced by the driver component is effectively dissipated via the heat dissipation member.

The display device may further include a panel receiving member that has a frame-like shape and receives the display panel by holding edges of an opposite surface of the display panel from the display surface. The signal transmission board may be mounted to the panel receiving member.

According to this configuration, the display panel and the signal transmission board connected to the flexible circuit board are both supported by the panel receiving member. Therefore, a positional relationship between the display panel and the signal transmission board is less likely to vary. When the flexible circuit board is bent, a preferable tension is properly exerted on the flexible circuit board. Furthermore, the contact portion is more stably in contact with the portion of the flexible circuit board on which the driver component is mounted.

The flexible circuit board may include a surface on which the driver component is mounted and in contact with the display panel and the signal transmission board.

According to this configuration, the flexible circuit board can be configured as a single-sided mounting type board. In comparison to a double-sided mounting type board, the production cost for the flexible circuit board can be reduced.

The frame-shaped member may be made of stainless steel and the contact portion may be made of aluminum.

This configuration provides examples of materials of the frame-shaped member and the contact portion to achieve higher thermal conductivity of the contact portion than that of the frame-shaped member while rigidity of the frame-shaped member is maintained.

According to the technology described herein, the display panel may be a liquid crystal panel including a pair of substrates and liquid crystals sealed between the substrates. Such a display device, that is, the liquid crystal display device can be applied to various devices including television devices and displays for personal computers. The liquid crystal display device is especially suitable for large screen applications.

Advantageous Effect of the Invention

According to the technology disclosed herein, heat from the driver component for driving the display panel is suppressed while the number of components is maintained small.

BRIEF DESCRIPTION OF THE DRAWINGS

FIG. 1 is an exploded perspective view of a television device TV according to a first embodiment illustrating a general configuration thereof.

MODE FOR CARRYING OUT THE INVENTION

First Embodiment

Figure 2:
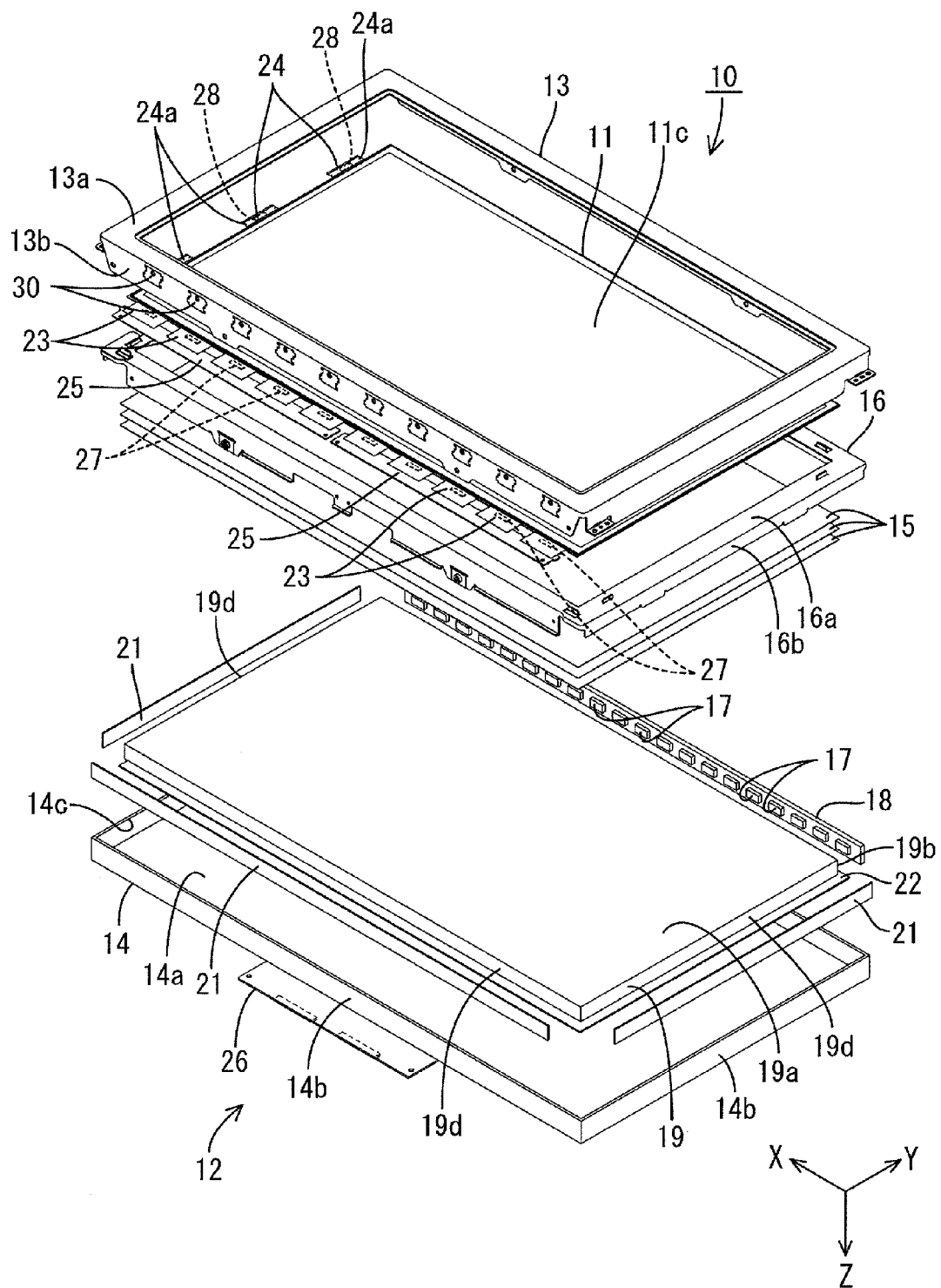
FIG. 2 is an exploded perspective view of a liquid crystal display device 10 illustrating a general configuration thereof.

A first embodiment will be described with reference to the drawings. A liquid crystal display device (an example of a display device) 10 according to this embodiment will be described. X-axis, Y-axis and Z-axis may be indicated in the drawings. The axes in each drawing correspond to the respective axes in other drawings. The Y-axis direction corresponds to a vertical direction and the X-axis direction corresponds to a horizontal direction. An upper side and a lower side are defined based on the vertical direction unless otherwise specified.

A television device TV includes the liquid crystal display device 10, front and rear cabinets Ca and Cb that hold the liquid crystal display device 10 therebetween, a power source P, a tuner T, and a stand S. An overall shape of the liquid crystal display device 10 is horizontally-long rectangular. The liquid crystal display device 10 includes a liquid crystal panel 11 as a display panel and a backlight unit (a lighting device) 12 as an external light source. The liquid crystal panel 11 and the backlight unit 12 are collectively held with a bezel 13 that is a frame-shaped member. In the liquid crystal display device 10, the liquid crystal panel 11 is fixed such that a display surface 11c for displaying images faces the front.

Figure 3:
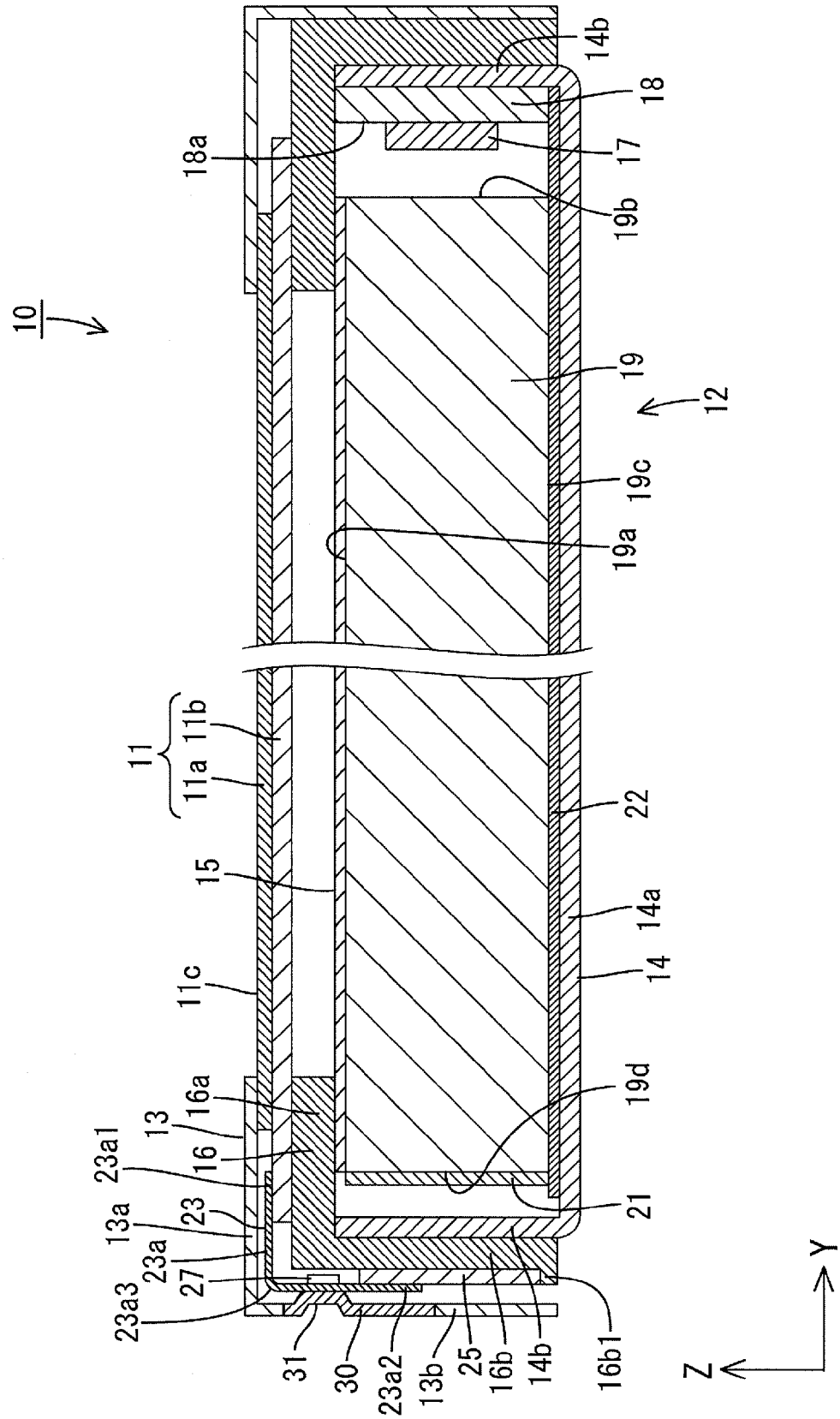
FIG. 3 is a cross-sectional view of the liquid crystal display device 10 along a short-side direction thereof.

The bezel 13 is made of metal having high rigidity such as stainless steel. As illustrated in FIGS. 2 and 3, the bezel 13 includes a bezel frame portion (an example of a top section) 13a and a bezel tubular portion (an example of a side section) 13b. The bezel frame portion 13a is parallel to the liquid crystal panel 11 and has a frame-like shape in a plan view. The bezel tubular portion 13b extends from peripheral edges of the bezel frame portion 13a toward the rear and has a short tubular shape. The bezel frame portion 13a extends along edges of the display surface 11c of the display panel 11. The bezel frame portion 13a retains the liquid crystal panel 11 by holding the edges of the display surface 11c from the front. The bezel tubular portion 13b covers a portion of an outer surface of a frame tubular portion 16b of a frame 16, which will be described later. On the portion covered with the bezel tubular portion 13b, a printed circuit board (an example of a signal transmission board) 25, which will be described later, is disposed. The bezel tubular portion 13b is attached to the frame 16 with portions of the frame 16 on which the printed circuit boards 25 are not disposed are in contact with the bezel tubular portion 13b. The bezel 13 is formed in a single piece. Heat dissipation members 30, which will be described later, are fitted in portions of the bezel tubular portion 13b. The heat dissipation members 30 will be described in detail later.

The backlight unit 12 will be described. As illustrated in FIG. 2, the backlight unit 12 includes a chassis 14 and an optical member 15. The chassis 14 has a box-like shape with an opening on the front (a light exit side, a liquid crystal panel 11 side). The optical member 15 is arranged so as to cover the opening of the opening of the chassis 14. LEDs (light emitting diodes) 17, an LED board (light source board) 18 on which the LEDs 17 are mounted, a light guide plate 19, and the frame (an example of a panel holding member) 16 are arranged in the chassis 14. The light guide plate 19 is configured to guide light from the LEDs 17 toward the optical member 15 (or the liquid crystal panel 11). The frame 16 covers the light guide plate 19 and the optical member 15 from the front. Furthermore, a control circuit board (a signal source board) 26 is mounted to the outer back surface of the chassis 14. The control circuit board is configured to supply control signals for driving the liquid crystal panel 11. In the backlight unit 12, the LED board 18 is arranged at one of long-edge portions (on the front in FIG. 2 or the left in FIG. 3) of the backlight unit 12. Namely, the LEDs 17 mounted on the LED board 18 are located closer to one of long-edge portions of the liquid crystal panel 11. The backlight unit 12 according to this embodiment is so-called an edge-light type (or a side-light type) backlight. Specifically, in the backlight unit 12, the LEDs 17 and the LED board 18 are arranged at the long edge on the far side in FIG. 2 (the right side in FIG. 3). Next, components of the backlight unit 12 will be described in detail.

The chassis 14 is made of a metal plate such as an aluminum plate and an electrolytic zinc-coated steel sheet (SECC) steel plate. As illustrated in FIGS. 2 and 3, the chassis 14 includes a bottom plate 14a and side plates 14b. The bottom plate 14a has a horizontally-long rectangular shape similar to the liquid crystal pane 11. The side plates 14b extend from outer long edges and outer short edges, that is, the side plates 14 include a pair of long-side plates and a pair of short-side plates. The chassis 14 (or the bottom plate 14a) is arranged such that a long-side direction and a short-side direction thereof correspond to the X-axis direction (the horizontal direction) and the Y-axis direction (the vertical direction), respectively. The bottom plate 14a extends along the light guide plate 19 and along a reflection sheet 22 held in the chassis 14. The bottom plate 14a supports the light guide plate 19 and the reflection sheet 22 from the rear. The control circuit board 26 is mounted to the back surface of the bottom plate 14a, that is, on a surface opposite from the light guide plate 19. The control circuit board 26 is arranged in a portion of the bottom plate 14a more to the left in FIG. 3 with respect to the short-side direction, that is, away from the LEDs 17 or the LED board 18 (closer to a source-side flexible circuit board 23 or the printed circuit boards 25). Other circuit boards including an LED driver board (not illustrated) for supplying driving power to the LEDs 17 are mounted on the bottom plate 14a in the same manner as the control circuit board 26. The frame 16 and the bezel 13 can be fixed to the chassis 14 with screws As illustrated in FIG. 2, similar to the liquid crystal panel 11 and the chassis 14, the optical member 15 has a horizontally-long rectangular shape in a plan view. The optical member 15 is placed on a front surface (a light exit side surface) of the light guide plate 19 between the liquid crystal panel 11 and the light guide plate 19. The optical member 15 is configured to pass light from the light guide plate 19, to add specific optical effects to the light, and to direct the light toward the liquid crystal panel 11. The optical member 15 includes multiple sheet-like members (three sheets in this embodiment) which are layered. Examples of the optical sheets (the optical member 15) include a diffuser sheet, a lens sheet, and a reflecting type polarizing sheet. The optical sheets may be selected from those as appropriate. In FIG. 3, the optical 15 including three sheets is illustrated in a simplified form.

The frame 16 is made of synthetic resin. As illustrated in FIGS. 2 and 3, the frame 16 includes a frame front face portion 16a and a frame tubular portion 16b. The frame front face portion 16a having a frame-like shape in a plan view is parallel to the optical member 15 and the light guide plate 19. The frame tubular portion 16b having a tubular shape projects from outer peripheral edges of the frame front face portion 16a to the rear. The frame front face portion 16a extends along the outer peripheral edges of the optical member 15 and the light guide plate 19. The frame front face portion 16 covers substantially entire outer edge portions of the optical member 15 and the light guide plate 19 from the front. The optical member 15 and the light guide plate 19 are arranged behind the frame front face portion 16a. The frame tubular portion 16a holds (or supports) substantially entire outer peripheral edge portions of the liquid crystal panel 11 from the rear. The liquid crystal panel 11 is arranged in front of the frame tubular portion 16a. The frame front face portion 16a is arranged between the liquid crystal panel 11 and the optical member 15 or the light guide plate 19. The frame tubular portion 16b is mounted with outer surfaces of the side plates 14b of the chassis 14 are in contact. A portion of the frame tubular portion 16b to which the printed circuit boards 25, which will be described later, are mounted (a near long-edge portion in FIG. 2) includes board support portions 16b1. The board support portions 16b1 project outward from some areas of the portion toward and support the printed circuit boards 25 from the rear. The board support portions 16b1 position the printed circuit boards 25 relative to the Z-axis direction. The long-edge portion on the right in FIG. 3 among the long-edge portions of the frame front face portion 16a is in contact with an end portion of the light guide plate 19 opposite the LEDs 17 (an end portion including the light entrance surface 19b) via the optical member 15. The long-edge portion collectively covers the end portion of the light guide plate 19 and the LED board 18 (the LEDs 17) from the front.

As illustrated in FIG. 3, each of the LEDs 17 includes an LED chip that is arranged on a board fixed to the LED board 18 and sealed with resin. The LED chip mounted on the board has one main light emission wavelength. Specifically, the LED chip that emits light in a single color of blue is used. The resin that reals the LED chip contains phosphors dispersed therein. The phosphors emit light in a predetermined color when excited by blue light emitted from the LED chip. Overall color of light emitted from the LED 17 is white. The phosphors may be selected, as appropriate, from yellow phosphors that emit yellow light, green phosphors that emit green light, and red phosphors that emit red light. The phosphors may be used in combination of the above phosphors. The LED 17 includes a main light-emitting surface that is opposite from a mounting surface of the LED 17 which is fixed to the LED board 18. Namely, the LED 17 is a so-called top-surface-emitting type LED.

As illustrated in FIGS. 2 and 3, the LED board 18 has an elongated plate-like shape that extends in the long-side direction of the chassis 14 (the X-axis direction, a longitudinal direction of the light entrance surface 19b of the light guide plate 19). The LED board 18 is held in the chassis 14 with a plate surface thereof parallel to the X-Z plane, that is, perpendicular to plate surfaces of the liquid crystal panel 11 and the light guide plate 19 (or the optical member 15). The LED board 18 is arranged adjacent to and on the right of the light guide plate 19 in FIG. 3 with a predetermined gap therebetween. The LED board 18 is attached to an inner surface of the side plate 14b on the long edge side on the right in FIG. 3. The arrangement direction of the LEDs 17, the LED board 18, and the light guide plate 19 substantially corresponds to the Y-axis direction. The Y-axis direction substantially corresponds to an optical axis of each LED 17, that is, a travel direction of light that has the highest intensity (parallel to the plate surface of the liquid crystal panel 11). The LEDs 17 are surface mounted on an inner surface of the LED board 18, that is, a surface that faces the light guide plate 19 (an opposed surface to the light guide plate 19). The inner surface is amounting surface 18a. The LEDs 17 are arranged in a line (linearly) on the mounting surface 18a of the LED board 18 at predetermined intervals along the longitudinal direction (the X-axis direction). Namely, the LEDs 17 are arranged at intervals at one of the long edge portions of the backlight unit 12 along the long-side direction. The intervals between the LEDs 17 are substantially equal, that is, an arrangement pitch of the LEDs 17 is substantially constant. An arrangement direction of the LEDs 17 matches the longitudinal direction of the LED board 18 (the X-axis direction).

On the mounting surface 18a of the LED board 18, a metal-film trace (e.g., a copper-foil trace) is formed (not illustrated). The metal-film trace extends in the X-axis direction and crosses over a group of the LEDs 17 so as to connect the adjacent LEDs 17 in series. Terminals are formed at ends of the trace. When the terminals are connected to an external LED driver board via an electrical line, which is not illustrated, driving power is supplied to the LEDs 17. A base member of the LED board 18 is made of metal, similar to the chassis 14. The trace is formed on a surface of the base member via an insulating layer (not illustrated). Ceramic or other insulating material may be used for the base member of the LED board 18.

The light guide plate 19 is made of substantially transparent (i.e., highly light transmissive) synthetic resin (e.g. PMMA resin or other acrylic resins, or polycarbonate) having a refractive index sufficiently higher than that of the air. As illustrated in FIG. 2, the light guide plate 19 has a horizontally-long rectangular shape in a plan view similar to the liquid crystal panel 11 and the chassis 14. The light guide plate 19 has a thickness larger than that of the optical member 15. A long-side direction and a short-side direction of the plate surface of the light guide plate 19 correspond to the X-axis direction and the Y-axis direction, respectively. A thickness direction of the light guide plate 19 that is perpendicular to the plate surface of the light guide plate 19 corresponds to the Z-axis direction. In FIG. 3, the light guide plate 19 is arranged below the liquid crystal panel 11 the optical member 15 inside the chassis 14. One of long-edge side surfaces of the outer peripheral surface of the light guide plate 19 (on the right in FIG. 3) is opposed to the LEDs 17 on the LED board 18 that is arranged at a long-edge side of the chassis 14. Namely, a direction in which the LEDs 17 (or the LED board 18) and the light guide plate 19 are arranged corresponds to the Y-axis direction (the vertical direction). Furthermore, a direction in which the optical member 15 (or the liquid crystal panel 11) and the light guide plate 19 are arranged corresponds to the Z-axis direction. These directions are perpendicular to each other. The light guide plate 19 is configured to guide the light, which is emitted from the LEDs 17 in the Y-axis direction, to receive the light through the long-edge side surface, transmit the light therethrough, and to direct the light toward the optical member 15 (the front side, the light exit side) such that the light exits the light guide plate 19 through the plate surface.

As illustrated in FIG. 3, one of the plate surfaces of the light guide plate 19 having a flat plate-like shape and facing toward the front (an opposed surface to the liquid crystal panel 11 or the optical member 15) is configured as a light exit surface 19a through which light exits toward the optical member 15 and the liquid crystal panel 11. One of the long-edge side surfaces of the outer peripheral surface of the light guide plate 19 extending along the X-axis direction and adjacent to the plate surface of the light guide plate 19 on the right in FIG. 3 is opposed to the LEDs 17 (or the LED board 18) with a predetermined gap. The surface is the light entrance surface (an example of an opposed surface) 19b through which light from the LEDs enters. Other side surfaces of the outer peripheral surface except for the long-edge side surface include the long-edge side surface opposite from the light entrance surface 19b and the short-edge side surfaces that extend in the Y-axis direction. These side surfaces are non-opposed surfaces 19d that do not face the LEDs 17. Side-surface reflection sheets 21 are attached to the LED non-opposed surfaces 19d. The side-surface reflection sheets 21 are configured to reflect rays of light that transmit through the light guide plate 19 and reach the LED non-opposed side surfaces 19d and to return the rays of light to the inside of the light guide plate 19. With the side-surface reflection sheets 21, light is effectively used.

As illustrated in FIG. 3, a reflection sheet 22 is attached to an opposite surface 19c of the plate surfaces of the light guide plate 19 on the rear, that is, on an opposite side from the light exit surface 19a so as to cover an entire area of the opposite surface 19c. The reflection sheet 22 is configured to reflect rays of light inside the light guide plate 19 toward the front. The reflection sheet 22 is arranged between the bottom plate 14a of the chassis 14 and the light guide plate 19. An end of the reflection sheet 22 extends outward over the light entrance surface 19b of the light guide plate 19. Rays of light from the LEDs 17 are reflected by an extending portion of the reflection sheet 22 which extends over the light entrance surface 19b. With this configuration, light entrance efficiency at the light entrance surface 19b improves. On a surface of at least one of the light exit surface 19a and the opposite surface 19c of the light guide plate 19 or the reflection sheet 22, alight scattering configured to scatter the rays of light inside the light guide plate 19 is formed by patterning to have a predetermined in-plane distribution (not illustrated). With the scattering portion, light exits from the light exit surface 19a with a uniform in-plane distribution.

Next, the configuration of the liquid crystal panel 11 will be described. As illustrated in FIGS. 2 and 3, the liquid crystal panel 11 has a horizontally-long rectangular shape in a plan view (rectangular, longitudinal). The liquid crystal panel 11 includes a pair of glass substrates 11a, 11b and liquid crystals. The substrates 11a, 11b having high light transmissivity are bonded together with a predetermined gap therebetween and the liquid crystals are sealed between the substrates 11a, 11b. The substrate on the front corresponds to a CF board 11a and the substrate on the rear corresponds to an array board 11b. On the array board 11b, switching elements (e.g. TFTs), pixel electrodes, and an alignment film are arranged. The switching elements are connected to gate lines and source lines that are arranged perpendicular to each other. The pixel electrodes are connected to the switching elements. On the array board 11b, a number of TFTs and a number of pixel electrodes are arranged. Furthermore, gate lines and source lines are arranged in a matrix around the TFTs and the pixel electrodes. The gate lines and the source lines are connected to gate electrodes and source electrodes of the TFTs, respectively. The pixel electrodes are connected to drain electrodes of the TFTs. On the array board 11b, capacitive lines (auxiliary capacitive lines, storage capacitive lines, Cs lines) are arranged parallel to the gate lines and so as to overlap the pixel electrodes in a plan view. The capacitive lines and the gate lines are alternately arranged in the Y-axis direction. On the CF board 11a, color filters, a counter electrode, and an alignment film are arranged. The color filters include red (R), green (G), and blue (B) color portions that are arranged in a predetermined arrangement. The display surface 11c of the liquid crystal panel 11 includes a display area and a non-display area. The display area is an inner area of a screen in which images are displayed. The non-display area is an outer area of the screen around the display area with a frame-like shape (or a picture frame-like shape). The polarizing plates (not illustrated) are arranged on outer sides of the boards 11a and 11b.

The array board 11b of the pair of boards 11a, 11b included in the liquid crystal panel 11 is slightly larger than the CP board 11a such that outer edge portions of the array board 11b project over outer edge portions of the CF board 11a for an entire periphery. Source terminals connected to the source lines are disposed on one of long outer edge portions of the outer edge portions of the array board 11b (the one on the near side in FIG. 2 or on the right in FIG. 3). Source flexible circuit boards 23 having flexibility are connected to the source terminals, respectively. The source flexible circuit boards 23 (ten of them in FIG. 2) are arranged at about equal intervals along the X-axis direction, that is, a direction along the long edge of the array board 11b. The source flexible circuit boards 23 project outward over the long edge of the array board 11b in the Y-axis direction. Gate terminals connected to the gate lines and the capacitive lines are disposed on one of short outer edge portions of the outer edge portions of the array board 11b (the ones on the far left side in FIG. 2). Gate flexible circuit boards 24 having flexibility are connected to the gate terminals, respectively. The gate flexible circuit boards 24 (three of them in FIG. 2) are arranged at about equal intervals along the Y-axis direction, that is, a direction along the short edge of the array board 11b. The gate flexible circuit boards 24 project outward over the short edge of the array board 11b in the X-axis direction.

As illustrated in FIGS. 2 and 3, each of the flexible circuit boards 23, 24 includes a film base member 23a or 24a made of synthetic resin (e.g., polyimide resin) having insulating and flexible properties. Each of the flexible circuit boards 23, 24 further includes a liquid crystal driver (an example of a driver component) 27, 28 mounted on the base member 23a or 24a. The base member 23a or 24a of the flexible member 23 or 24 has a horizontally-long rectangular shape. The drivers 27, 28 are mounted on inner surfaces of the respective base members 23a, 24a (on the liquid crystal panel 11 side or the printed circuit board 25 side) so as to project inward from the inner surfaces and thus form projection-like shapes. Each of the drivers 27, 28 has a horizontally-long rectangular shape. Each of the drivers 27, 28 is an LSI chip including a drive circuit therein configured to process image-related input signals from the control circuit board 26, which is a signal source, to generate output signals, and to input the output signals to the liquid crystal panel 11.

As illustrated in FIG. 2, one of ends (an inner end) of each gate flexible circuit board 24 is pressure bonded to the corresponding gate terminal on the array board 11b via an anisotropic conductive film. A number of traces (not illustrated) are formed on an inner surface of the base member 24a of each gate flexible circuit board 24 (on the liquid crystal panel 11 side or the printed circuit board 25 side). Ends of the traces on one side are connected to the gate terminal of the liquid crystal panel and ends of the trances on the other side are connected to the gate driver 28. The traces and the driver 28 are arranged on a selected surface of each gate flexible circuit board 24, that is, each gate flexible circuit board 24 is a single-sided mounting type board. An insulating layer is formed on the inner surface of each base member 24a so as to cover large areas of the traces except for the ends of the traces at one end to provide insulation for the traces. Relay lines for establishing connection between the source terminals and the respective gate terminals are formed on the array board 11b (not illustrated). Through the relay lines, signals (e.g., scanning signals to the gate lines, capacitive signals to the capacitive lines) from the source flexible circuit boards 23 and the source terminals are transmitted to the gate terminals and the gate flexible circuit boards 24.

Figure 4:
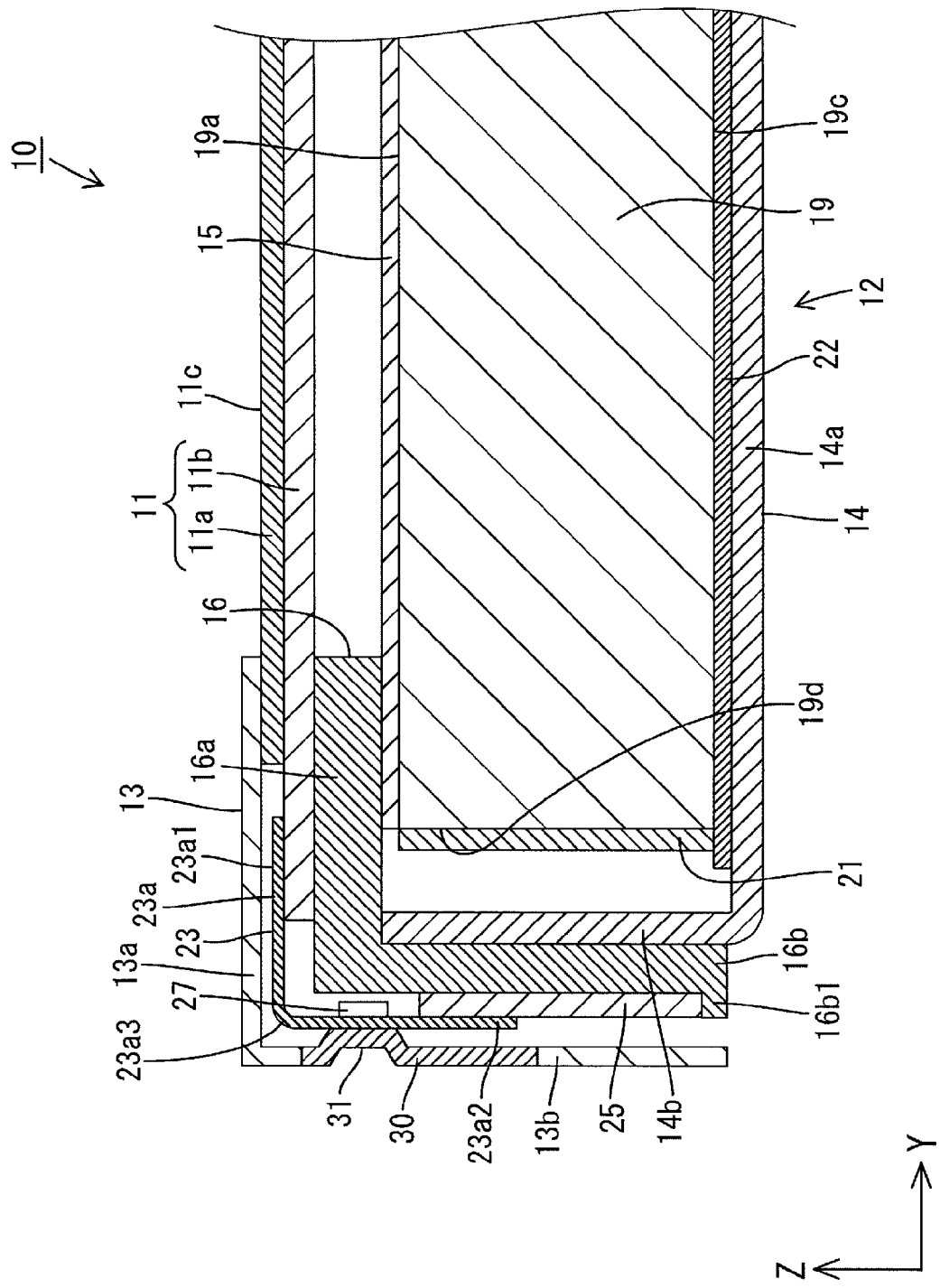
FIG. 4 is a magnified cross-sectional view of a heat dissipation member 30 and therearound illustrated in FIG. 3.

As illustrated in FIGS. 2 and 4, one end (an inner end) and the other end (an outer end) of each source flexible circuit board 23 are pressured bonded to the corresponding source terminal on the array board 11b and a corresponding terminal of the printed circuit board (a signal transmission board) 25, which will be described later, respectively, via anisotropic conductive films (ACFs). An end of the base member 23a of each source flexible circuit board 23 on one side connected to the liquid crystal panel 11 is referred to as a first connecting portion 23a1. An end of the base member 23a of each source flexible circuit board 23 on the other side connected to the printed circuit board 25 is referred to as a second connecting portion 23a2. A number of traces (not illustrated) are formed on an inner surface of the base member 23a of each source flexible circuit board 23 (on the liquid crystal panel 11 side or the printed circuit board 25 side). Ends of the traces on one side are arranged in the first connecting portion 23a1 and connected to the source terminal of the liquid crystal panel 11. Ends of the traces on the other side are arranged in the second connecting portion 23a2 and connected to the terminals on the printed circuit boards. Portions of the traces between the ends on one side and the end on the other side (i.e., middle portions) are connected to a source driver 27 mounted on the inner surface of the base member 23a. The source driver 27 is arranged in an area of the inner surface of the base member 23a closer to the other side, that is, closer to the second connecting portion 23a2. The traces and the source driver 27 are arranged on a selected surface of each source flexible circuit board 23, that is, each source flexible circuit board 23 is a single-sided mounting type board. An insulating layer is formed on the inner surface of each base member 23a so as to cover large areas of the traces except for the ends of the traces to provide insulation for the traces.

As illustrated in FIG. 3, the printed circuit boards 25 are connected to the source flexible circuit boards 23. The printed circuit boards 25 are also connected to the control circuit board 26 attached to the backside of the backlight unit 12 (on a side opposite from the liquid crystal panel 11) via flexible printed circuits (FPCs, not illustrated). The printed circuit boards 25 are configured to receive input signals from the control circuit board 26 (e.g., scanning signals to the gate lines, data signals to the source lines, capacitive signals to the capacitive lines) and transmit the signals to the source flexible circuit boards 23. With this configuration, images are displayed in the display area of the display surface 11c of the liquid crystal panel 11 according to the input signals from the control circuit board 26.

As illustrated in FIG. 2, each printed circuit board 25 has an elongated plate-like shape that extends in the X-axis direction. The printed circuit board 25 is mounted on the outer surface of the long-side portion of the frame tubular portion 16b of the frame 16 on the left in FIG. 3 with the plate surface of the printed circuit board 25 parallel to the X-Z plane, that is, substantially perpendicular to the plate surface of the liquid crystal panel 11. The base member 23a of each source flexible circuit board 23 connected to the printed circuit board 25 and the liquid crystal panel 11 includes a bending portion 23a3 that bends at about a right angle between the connecting portions 23a1 and 23a2. Namely, the base member 23a of each source flexible circuit board 23 has an L-like cross section when viewed from the side. In FIG. 2, the base members 23a of the source flexible circuit boards 23 before bent are illustrated. Each printed circuit board 25 is arranged such that the side plate 14b of the chassis 14 on the long edge side and the long-side portion of the frame tubular portion 16b of the frame 16 are arranged between the printed circuit board 25 and the non-opposed surface 19d of the light guide plate 19 on the long-edge side. Each printed circuit board 25 is held in a position such that the longitudinal direction (the long-side direction), the width direction (the short-side direction, and the thickness direction correspond to the X-axis direction, the Z-axis direction, and the Y-axis direction, respectively. Furthermore, the printed circuit board 25 is held parallel to the side plate 14b of the chassis 14 on the long-edge side, the long-side portion of the tubular portion 16b of the frame 16, and the LED board 18. The printed circuit board 25 has a length about a half of a long dimension of the liquid crystal panel 11. Two printed circuit boards 25 are arranged along the long-side direction of the liquid crystal panel 11 (the X-axis direction). Five source flexible circuit boards 23 arranged along the X-axis direction are connected to each printed circuit board 25.

Figure 6:
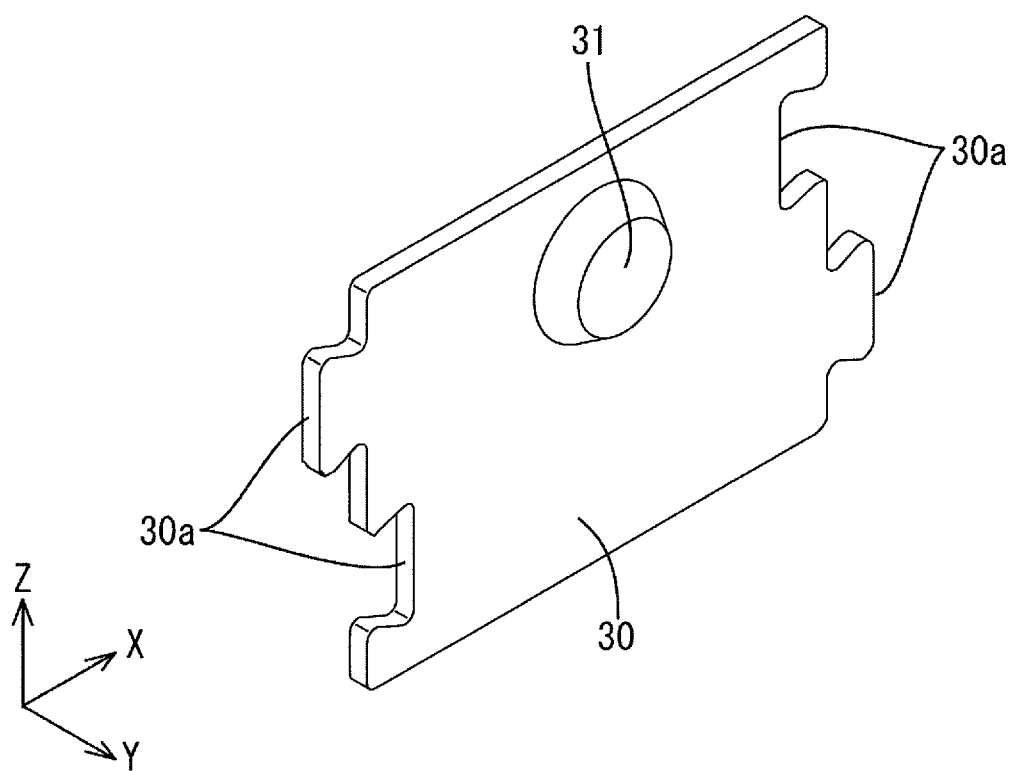
FIG. 6 is a perspective view of the heat dissipation member 30.

Each printed circuit board 25 includes a plate-like shaped base member made of synthetic resin. As illustrated in FIGS. 4 and 6, metal traces are formed on the base member by patterning and a terminal connected to at least a portion of the metal traces (not illustrated) and a connector 25a are arranged on the base member. The second connecting portion 23a2 of the source flexible circuit board 23 is connected to the terminal via the ACF. The terminal is located closer to the middle portion of the printed circuit board 25 than the front edge of the printed circuit board 25 (on the liquid crystal panel 11 side) with respect to the width direction of the printed circuit board 25 (the Z-axis direction). A portion of the source flexible circuit board 23 connected to the terminal located closer to the middle portion than the second connecting portion 23a2 (including the source driver 27) crosses the front end of the printed circuit board 25 with respect to the width direction of the printed circuit board 25. The connector 25a is arranged at the edge of the printed circuit board 25 on the rear side with respect to the width direction of the printed circuit board 25 (on the opposite side from the liquid crystal panel 11, the control circuit board 26 side). An end of an FPC 29 on a side opposite from the control circuit board 26 is inserted into the connector 25a. As a result, electrical connection between the connector 25a and the FPC 29 is established.

Next, the heat dissipation members 30 embedded in some portions of the bezel 13 will be described. The heat dissipation members 30 are major portions of this embodiment. As illustrated in FIG. 2, the heat dissipation members 30 are embedded in a portion of the bezel tubular portion 13b of the bezel 13 which covers the printed circuit boards 25 and the source flexible circuit boards 23. The heat dissipation members 30 are arranged separately from one another along the X-axis direction. The heat dissipation members 30 are arranged at positions opposite the source flexible circuit boards 23 arranged along the X-axis direction. The heat dissipation members 30 are made of material having higher thermal conductivity than that of the bezel 13 (e.g., aluminum). When the bezel tubular portion 13b is viewed from the front, each heat dissipation member 30 looks substantially square. The heat dissipation members 30 are embedded in the portion of the bezel tubular portion 13b as such. The heat dissipation members 30 are arranged in the portion of the bezel tubular portion 13b closer to the front (closer to the liquid crystal panel 11). Each heat dissipation member 30 having a substantially square shape has an outline substantially along the X-axis direction and the Z-axis. The thickness of the heat dissipation member 30 (measuring in the Y-axis direction) is substantially equal to the thickness of the bezel tubular portion 13b (see FIG. 4).

Each heat dissipation member 30 includes a contact portion 31 that projects toward the source driver 27 and a distal end of the contact portion 31 contacts a portion of the flexible circuit board 23 on which the source driver 27 is arranged. The contact portion 31 has a round shape (see FIG. 8) when the bezel tubular portion 13b is viewed from the front. In the cross-sectional view in FIG. 4, the contact portion 31 has a trapezoidal shape that is recessed toward the flexible circuit board 23. The contact portion 31 has a bottom surface (a distal end surface that is an end of projection toward the source driver 27) contact a portion of the surface of the flexible circuit board 23 opposite from the mounting surface on which the source driver 27 is mounted and right behind the source driver 27. The contact portion 31 is located in a portion of the heat dissipation member 30 closer to the front (closer to the liquid crystal panel 11) when the heat dissipation member 30 is embedded in the bezel tubular portion 13b. Because the contact portion of the heat dissipation member 30 is in contact with the flexible circuit board 23, even when heat is produced by the source driver 27 while the source driver 27 is turned on, the heat is stably transferred from the flexible circuit board 23 to the heat dissipation member 30 via the contact portion 31. Then, the heat is effectively dissipated to the outside of the bezel tubular portion 13b via the heat dissipation member 30 (i.e., the outside of the liquid crystal display device 10).

Figure 7:
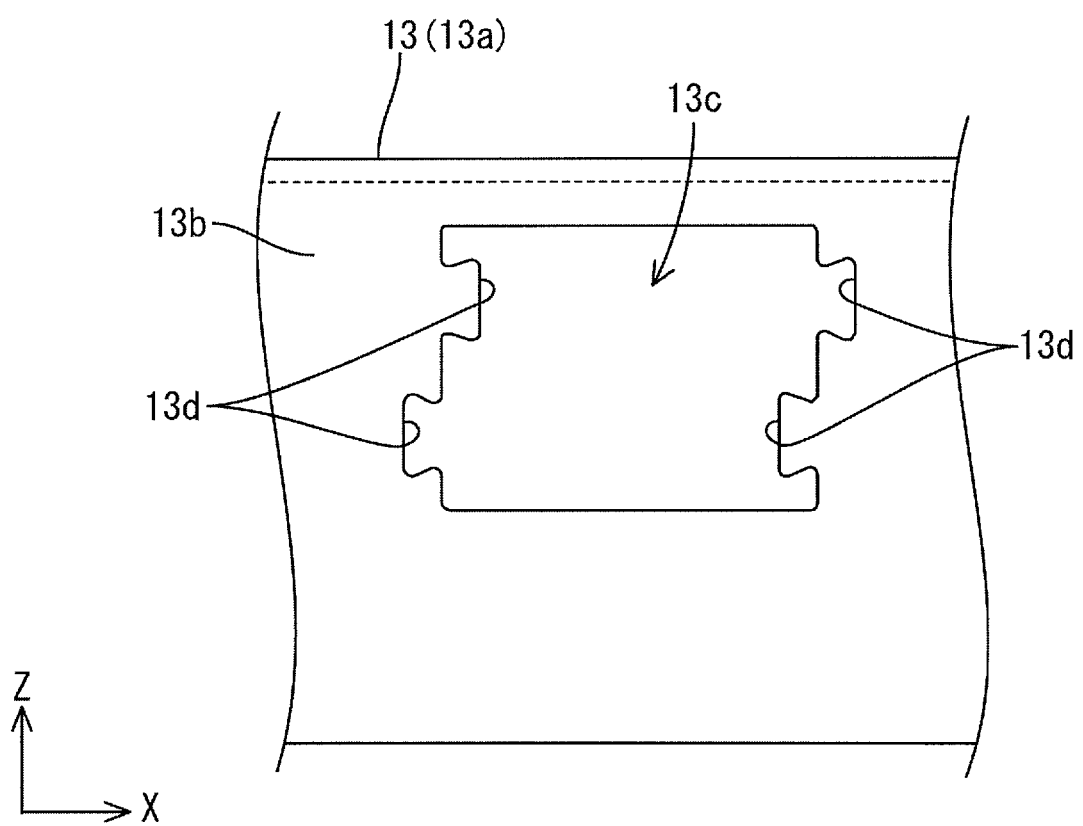
FIG. 7 is a side view of a portion of a bezel 13 viewed from a side before the heat dissipation member 30 is fitted.

As illustrated in FIG. 7, the bezel frame portion 13a includes embedding holes 13c in portions in which the heat dissipation members 30 are embedded, respectively. Before the heat dissipation members 30 are embedded, each hole 13c is open in a shape corresponding to an outline of each heat dissipation member 30. Each heat dissipation member 30 includes heat dissipation member irregular edges 30a at ends with respect to the horizontal direction (the X-axis direction) as illustrated in FIG. 6. Each heat dissipation member irregular edge 30a includes tabs and blanks. Each embedding hole 13c of the bezel tubular portion 13b has bezel irregular edge portions 13d as illustrated in FIG. 7. Each bezel irregular edge portion 13d includes tabs and blanks that have shapes and sizes to fit the respective blanks and tabs of the heat dissipation member irregular edge 30a. When the heat dissipation member 30 is fitted in the corresponding embedding hole 13c, the heat dissipation member irregular edges 30a of the heat dissipation member 20 are engaged with the respective bezel irregular edge portions 13d of the embedding hole 13c. As a result, the heat dissipation member 30 is fitted in the corresponding embedding hole 13c. The size of the heat dissipation member 30 before fitted in the embedding hole 13c is slightly larger than the embedding hole 13c formed in the bezel frame portion 13a. Therefore, when the heat dissipation member 30 is fitted in the embedding hole 13c, the tabs and blanks of the heat dissipation member 30 are engaged with the blanks and tabs of the embedding hole 13c without gaps and thus the heat dissipating member 30 are less likely to come out of the embedding hole 13c.

This embodiment has the configuration described above. Functions of this embodiment will be described. When the liquid crystal display device 10 having the above-described configuration is turned on, various signals related to images are transmitted from the control circuit board 26, which is a signal source, to the printed circuit boards 25 via the FPCs. The signals are processed by the source drivers 27 of the source flexible circuit boards 23 and transmitted to the liquid crystal panel 11. Depending on kinds, some of the signals transmitted to the liquid crystal panel 11 are transmitted to the source lines via the source terminals and some of the signals are transmitted to the gate lines or the capacitive lines after processed by the gate drivers 28 of the gate flexible circuit boards 24 via the source terminals and the gate terminals. According to the signals, the driving of the liquid crystal panel 11 is controlled. Driving power is supplied from the LED driver board, which is a power source for the LEDs 17, to the LED boards 18. With this configuration, the driving of the LEDs mounted on the LED boards 18 is controlled. The rays of light from the LEDs 17 are directed by the light guide plate 19 to the liquid crystal panel 11 via the optical member 15. With this configuration, predetermined images are displayed on the liquid crystal panel 11.

While the liquid crystal display device 10 is in operation, electrical components that are turned on produce heat. If the source drivers 27 of the source flexible circuit boards 23 for controlling the driving of the liquid crystal panel 11 produce heat while they are turned on and the temperatures thereof exceed an expected high temperature, the source driers 27 may not be able to properly process the signals. As a result, display quality of images on the liquid crystal panel 11 significantly decreases or the source drivers 27 may malfunction and images are not displayed on the liquid crystal panel 11. Especially, for displaying high-definition images on the liquid crystal panel 11, a data rate of the signals increases and the amounts of heat produced by the source drivers 27 tend to increase. In this embodiment, as illustrated in FIG. 4, the contact portions of the heat dissipation members 30 are in contact with the portions of the source flexible circuit boards 23 on which the source drivers 27 are mounted, respectively. Therefore, the heat produced by the source drivers 27 are effectively dissipated to the heat dissipation members 30. The heat dissipation members 30 have higher thermal conductivity than the bezel 13. In comparison to a configuration in which the source flexible circuit boards 23 are in contact with portions of the bezel 13, the heat produced by the source drivers 27 is effectively dissipated. Furthermore, the base member 23a of each source flexible circuit board 23 has flexibility and the source flexible circuit board 23 is bent. Namely, a tension is exerted between the first connecting portion 23a1 connected to the liquid crystal panel 11 and the second connecting portion 23a2 connected to the printed circuit board 25. The contact portion 31 of the heat dissipation member 30 is in contact with the source flexible circuit board 23 on which the tension is exerted. Therefore, an opposite side of the source flexible circuit board 23 from the side with which the contact portion 31 is in contact is less likely to deform. Therefore, contact between the printed circuit board 25 and the source driver 27 is stably maintained.

The bezel 13 is formed in a single piece. In comparison to a configuration that includes multiple components assembled into the bezel 13, if the bezel 13 has such a configuration, the number of components is small. Therefore, a parts cost can be reduced. In the manufacturing process of the liquid crystal display device 10, the bezel 13 formed in a signal piece is prepared and the heat dissipation members 30 are fitted in the respective embedding holes 13c in the bezel 13. In comparison to the configuration including the multiple components of the bezel 13, the manufacturing process can be simplified.

In the liquid crystal display device 10 according to this embodiment, even when heat is present around the source drivers 27 during driving of the source drivers 27, the portions in which the heat is present (portions on which the source drivers 27 are mounted) are in contact with the contact portions 31 of the heat dissipation members 30 having higher thermal conductivity than the bezel 13 and thus heat is effectively dissipated to the outside of the liquid crystal display device 10 via the heat dissipation members 30. Therefore, the heat from the source drivers 27 is effectively suppressed. Because the heat dissipation members 30 are embedded in the portions of the bezel 13, the other portions of the bezel 13 in which the heat dissipation members 30 are not embedded can be integrally formed. Namely, it is not necessary to use a bezel including multiple components connected together and thus the number of components can be reduced. In the liquid crystal display device 11 described above, the amounts of heat from the source drivers 27 that are for driving the liquid crystal panel 11 can be reduced while the number of components is reduced.

In this embodiment, the bezel 13 includes the bezel frame portion 13a and the bezel tubular portion 13b. The bezel frame portion 13a is arranged parallel to the display surface 11c of the liquid crystal panel 11. The bezel tubular portion 13b extends from the outer edges of the bezel frame portion 13a to the rear (extends not parallel to the bezel frame portion 13a). The contact portions 31 of the heat dissipation members 30 are embedded in the portions of the bezel tubular portion 13b. According to this configuration, the contact portions 31 are disposed so as to project on a side different from the display surface 11c side of the liquid crystal panel 11 (behind the display surface 11c). With this configuration, the heat produced by the source drivers 27 dissipated via the contact portions 31 is less likely to affect the liquid crystal panel 11.

In this embodiment, the heat dissipation members 30 are embedded in the bezel 13 such that the edges thereof are engaged with the portions of the bezel 13. According to this configuration in which the heat dissipation members 30 are engaged with the portions of the bezel 13, the heat dissipation members 30 are less likely to come off the bezel 13.

In this embodiment, the source flexible circuit boards 23 are arranged separated from one another and connected to the liquid crystal panel 11 and the printed circuit boards 25. Furthermore, the heat dissipation members 30 are embedded in the bezel 13 so as to correspond to the source flexible circuit boards 23. According to this configuration, the contact portions 31 of the heat dissipation members 30 contact the source drivers 27 mounted on the source flexible circuit boards 23, respectively, the heat produced by the source drivers 27 is effectively dissipated by the heat dissipation members 30.

In this embodiment, the printed circuit boards 25 are arranged with the plate surfaces thereof perpendicular to the display surface 11c of the liquid crystal panel 11. Each source flexible circuit board 23 includes the bending portion 23a3 that bends at about a right angle. According to this configuration, the tension is effectively exerted on the source flexible circuit board 23 and the source flexible circuit board 23 is under tension. Therefore, the contact portions 31 are stably in contact with the portions of the respective source flexible circuit boards 23 in which the source drivers 27 are arranged.

This embodiment includes the backlight unit 12 arranged on the opposite side of the liquid crystal panel 11 from the display surface 11c. The backlight unit 12 is configured to supply the liquid crystal panel with illumination light. The backlight unit 12 includes the LEDs 17, the light guide plate 19, and the chassis 14. The light guide plate 19 includes the opposed surface 19b that is opposed to the LEDs 17 and the non-opposed surface 19d that is not opposed to the LEDs 17. The light guide plate 19 is configured to direct the rays of light from the LEDs 17 toward the liquid crystal panel 11. The chassis 14 holds at least the LEDs 17 and the light guide plate 19 therein. Each printed circuit board 25 is arranged parallel to the non-opposed surface 19d and such that at least the chassis 14 is sandwiched between the printed circuit board 25 and the non-opposed surface 19d. In the backlight unit 12 that has such a configuration in which the LEDs 17 are opposite the opposed surface 19b of the light guide plate 19, the LEDs 17 are concentrated in the end portion of the backlight unit 12 close to the opposed surface 19b. The temperature of the end portion tends to increase due to the heat produced by the LEDs 17 as they are turned on. In this embodiment, each printed circuit board 25 is arranged parallel to the non-opposed surface 19d and such that at least the chassis 14 is sandwiched between the printed circuit board 25 and the non-opposed surface 19d. Therefore, the printed circuit boards 25 are less likely to be subjected to the heat from the LEDs 17 and thus the heat produced by the source drivers 27 is effectively dissipated via the heat dissipation members 30.

This embodiment includes the frame 16 that has a frame-like shape and receives the liquid crystal panel 11 while holding the edges of the opposite surface of the liquid crystal panel 11 from the display surface 11c. The printed circuit boards 25 are mounted to the frame 16. According to this embodiment, the liquid crystal panel 11 and the printed circuit boards 25 connected to the source flexible circuit boards 23 are held by the frame 16. Therefore, positions of the printed circuit boards 25 relative to the liquid crystal panel 11 are less likely to vary. When the source flexible circuit boards 23 are bend, a preferable tension is properly exerted on the source flexible circuit boards 23. Furthermore, the contact portions 31 are stably in contact with the portions of the source flexible circuit boards 23 in which the source drivers 27 are arranged, respectively.

In this embodiment, the surfaces of the source flexible circuit boards 23 with which the liquid crystal panel 11 and the printed circuit boards 25 are in contact are the surfaces on which the source drivers 27 are mounted. According to this configuration, the source flexible circuit boards 23 can be configured as single-sided mounting type boards. In comparison to double-sided mounting type boards, the production cost for the source flexible circuit boards 23 can be reduced.

Second Embodiment

Figure 8:
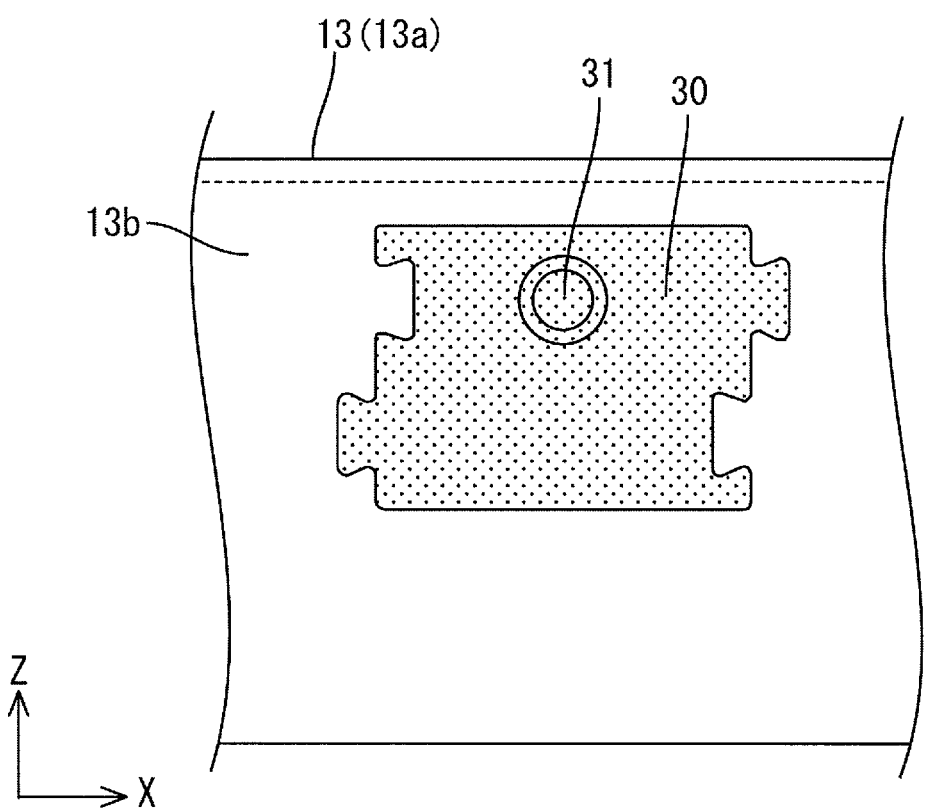
FIG. 8 is a side view of the portion of a bezel 13 viewed from the side after the heat dissipation member 30 is fitted.
Figure 9:
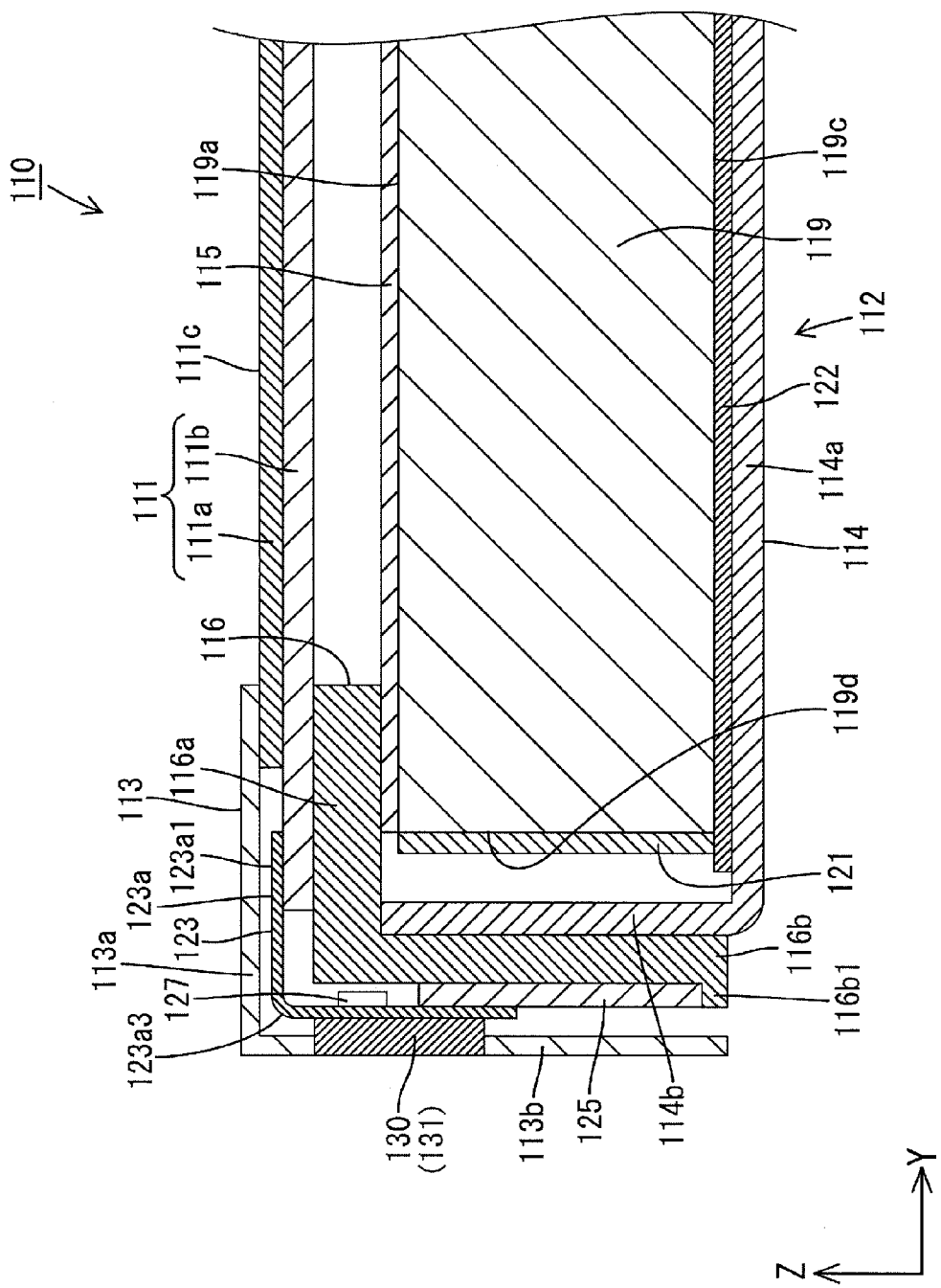
FIG. 9 is a cross-sectional view of a heat dissipation member 130 and therearound according to a second embodiment.
Figure 11:
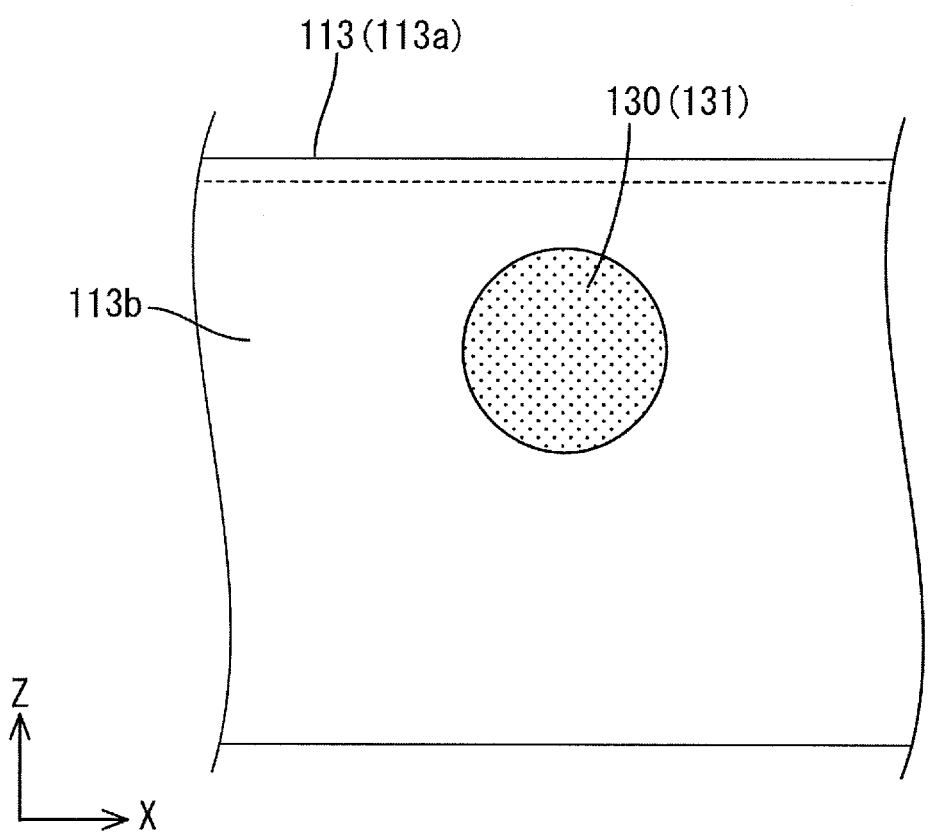
FIG. 11 is a side view of a portion of a bezel 113 viewed from the side after the heat dissipation member 130 is fitted.

A second embodiment will be described with reference to the drawings. The second embodiment includes heat dissipation members 130 having different shapes from those in the first embodiment. Furthermore, how the heat dissipation members 130 are embedded in a bezel 113 is different from that of the first embodiment. Other configurations are similar to the first embodiment. Similar configurations, operations, and effects to the first embodiment will not be described. In FIGS. 9 and 11, portions indicated by numerals including the reference numerals in FIGS. 4 and 8 with 100 added thereto have the same configurations as the portions indicated by the respective reference numerals in the first embodiment.

Figure 10:
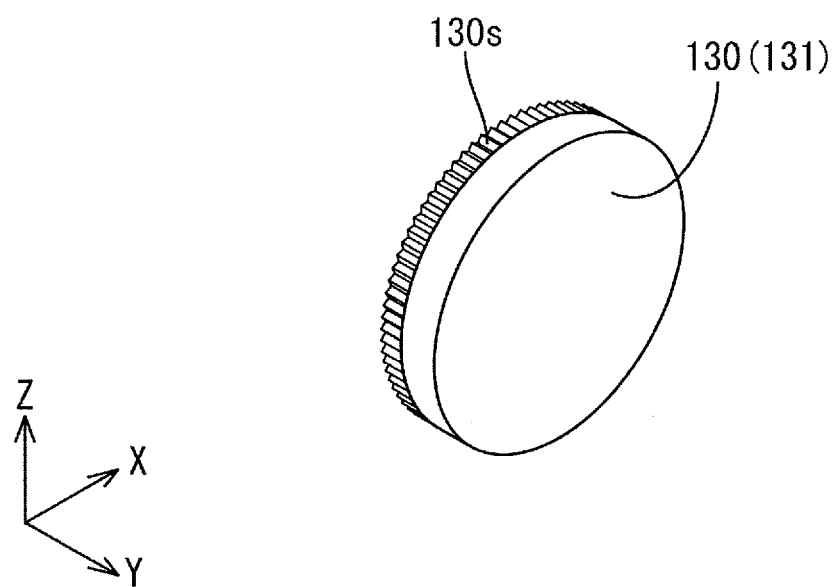
FIG. 10 is a perspective view of the heat dissipation member 130.

As illustrated in FIG. 10, in a liquid crystal display device 110 according to the second embodiment, each heat dissipation member 130 embedded in a bezel tubular portion 113b has a round column-like shape. A portion of rim of the heat dissipation member 130 is milled and small grooves 130s are formed therein. Embedding holes 113c are formed in the bezel tubular portion 113b. The heat dissipation members 130 are fitted in the respective embedding holes 113c. As illustrated in FIG. 11, each embedding hole 113c has a round shape corresponding to the shape of the heat dissipation member 130. In this embodiment, an entire area of each heat dissipation member 130 is a contact portion 131. As illustrated in FIG. 9, the entire heat dissipation member 130 project toward a flexible circuit board 123 and a distal end (one of bottom surfaces of the heat dissipation member 130 having a round column-like shape) is in contact with a portion of the flexible circuit board 123 on which a source driver 127 is mounted. According to this configuration, a contact area between the contact portion 131 and the source flexible circuit board 123 is larger in comparison to the first embodiment. According to this configuration, heat produced by the source driver 127 is more effectively dissipated via the contact portion.

Similar to the first embodiment, a size of each heat dissipation member 130 before fitted in the embedding hole 113c is slightly larger than a size of the embedding hole 113c in the bezel frame portion 113a. During the fitting of the heat dissipation member 130 having a round column-like shape, the heat dissipation member 130 is press-fitted in the embedding hole 113c so that the heat dissipation member 130 is fitted in the embedding hole 113c. The heat dissipation member 130 fitted in the embedding hole 113c is held in the embedding hole 113c without a gap and less likely to come out of the embedding hole 113c. During the press-fitting of the heat dissipation member 130 in the embedding hole 113c, a metal flows into the grooves 130s. This configuration improves a strength at a boundary between the embedding hole 113c and the heat dissipation member 130.

Third Embodiment

Figure 5:
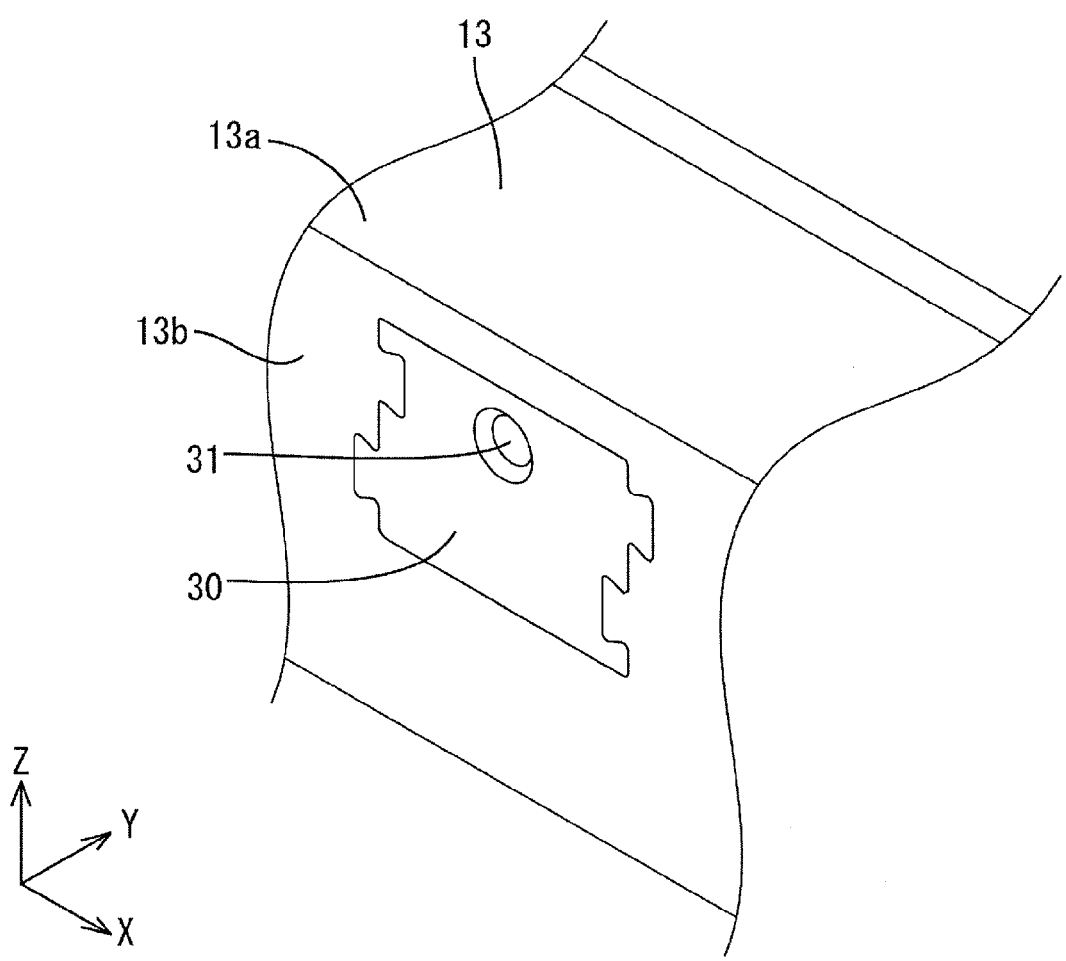
FIG. 5 is a magnified cross-sectional view of the heat dissipation member 30 and therearound illustrated in FIG. 2.
Figure 12:
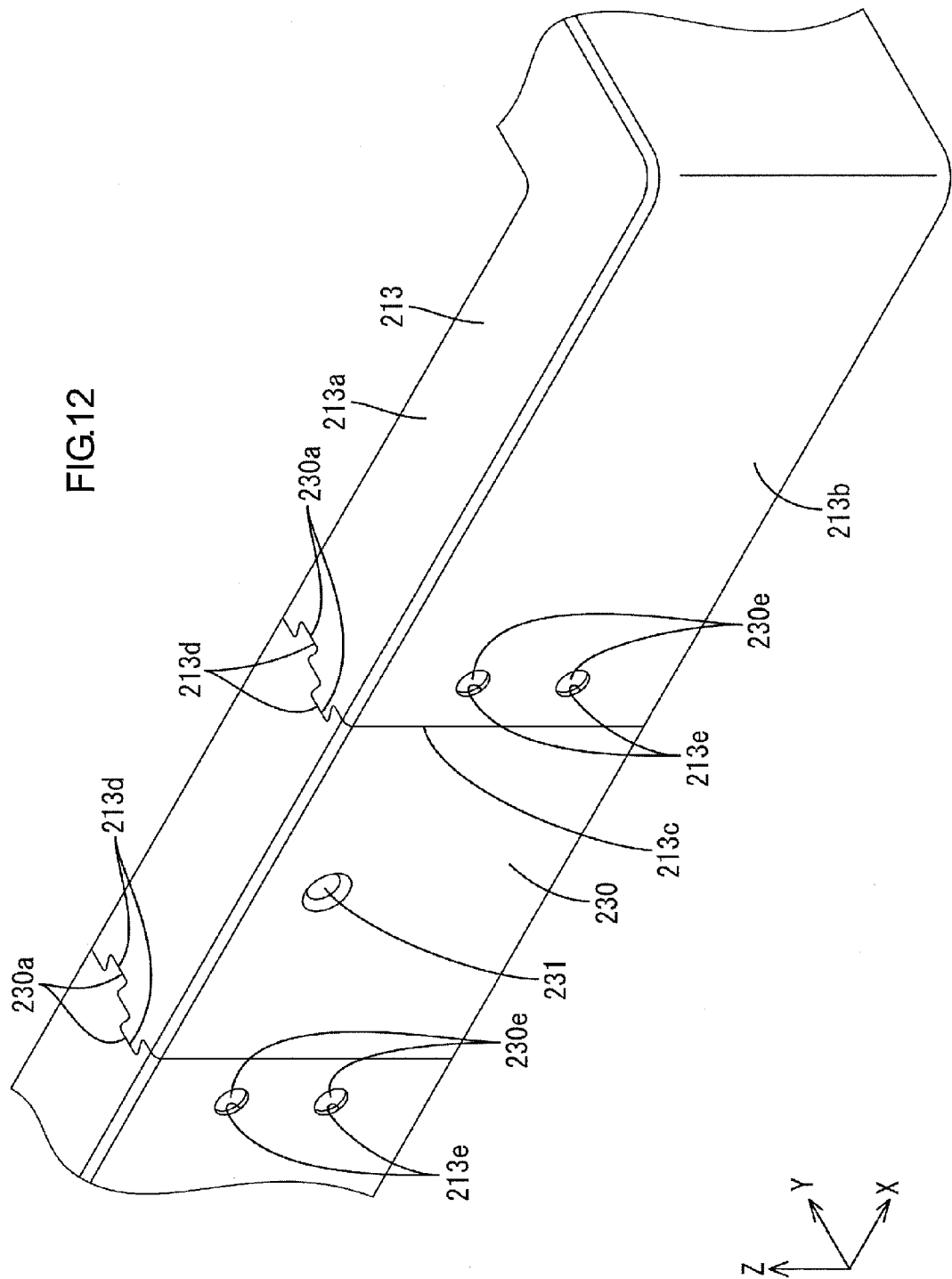
FIG. 12 is a cross-sectional view of a heat dissipation member 230 and therearound according to a third embodiment.
Figure 13:
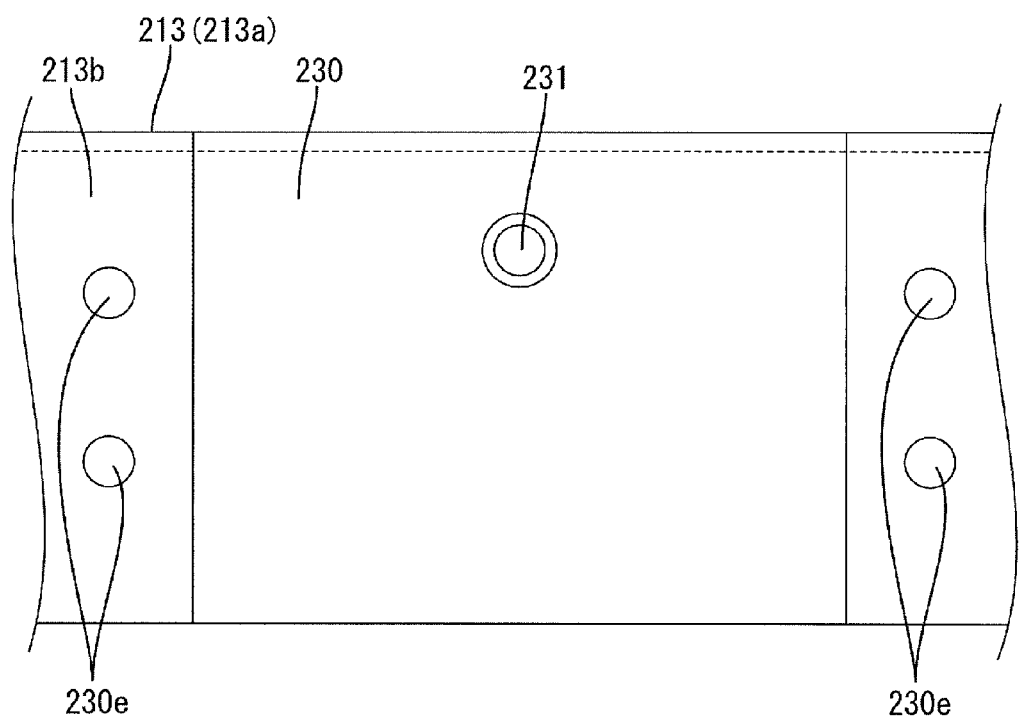
FIG. 13 is a side view of a portion of a bezel 213 viewed from the side after the heat dissipation member 230 is fitted.

A third embodiment will be described with reference to the drawings. The third embodiment includes heat dissipation members 230 each having a different shape from that of the first embodiment. Furthermore, portions of a bezel 213 in which the heat dissipation members 230 are embedded are different from the first embodiment. Other configurations are similar to the first embodiment. Similar configurations, operations, and effects to the first embodiment will not be described. In FIGS. 12 and 13, portions indicated by numerals including the reference numerals in FIGS. 5 and 8 with 200 added thereto have the same configurations as the portions indicated by the respective reference numerals in the first embodiment.

In a liquid crystal display device 210 according to the third embodiment, as illustrated in FIG. 12, the heat dissipation members 230 are portions of the bezel 213. Specifically, before each heat dissipation member 230 is embedded in the bezel 213, a portion of the bezel 213 between a bezel frame portion 213a and a bezel tubular portion 213b is void. After the heat dissipation member 230 is embedded in the bezel 213, the heat dissipation member 230 fills the portion between the bezel frame portion 213a and the bezel tubular portion 213b. As illustrated in FIG. 13, a contact portion 231 is embedded in a portion of the bezel tubular portion 213b of the heat dissipation member 230. A shape of the contact portion 231 and how the contact portion 231 contacts the source flexible circuit board are similar to those of the first embodiment. According to the heat dissipation member 230 having such a configuration and an arrangement, the contact portion 231 of each heat dissipation member 230 is in contact with the portion of the source flexible circuit board on which the source driver is mounted. Therefore, heat produced by the source driver is effectively dissipated via the heat dissipation member 230.

Similar to the first embodiment, in this embodiment, a size of each heat dissipation member 230 before fitted in the embedding hole 213c is slightly larger than a size of the embedding hole 213c in the bezel frame portion 213a. In this embodiment, each heat dissipation member 230 includes heat dissipation member tabs and blanks 230a at horizontal ends that are embedded in the bezel tubular portion 213a (with respect to the X-axis direction). As illustrated in FIG. 12, edges of each embedding hole 213c in the bezel frame portion 213a include bezel tabs and blanks 213d having shapes and sizes that fit the respective heat dissipation member tabs and blanks 230a. Similar to the configuration illustrated in FIG. 1, when the heat dissipation member tabs and blanks 230a are engaged with the respective bezel tabs and blanks 213d, a portion of each heat dissipation member 230 is embedded in a portion of the bezel frame portion 213a. Portions of the bezel tubular portion 213b adjacent to the horizontal ends of the embedding hole 213c (with respect to the X-axis direction) include small round fixing holes 213e. The heat dissipation member 230 includes fixing protrusions 230e that are fitted in the respective fixing holes 213e. The fixing protrusions 230e are located in portions of the heat dissipation member 230 adjacent to the portion thereof embedded in the portion of the bezel tubular portion 213b in the horizontal direction (i.e., the X-axis direction).

Tips of the fixing protrusions 230e fitted in the respective fixing holes 213e are swaged to the bezel tubular portion 213b from the front side thereof. As a result, the fixing protrusions 230e are properly fitted in the fixing holes 213e and the portion of the heat dissipation member 230 is embedded in the portion of the bezel tubular portion 213b. According to the configuration of this embodiment including the heat dissipation members 230 each engaged with the portion of the bezel frame portion 213a and swaged to the portion of the bezel tubular portion 213b, the heat dissipation members 230 embedded in the bezel are further less likely to come out of the embedding holes 213c.

Fourth Embodiment

Figure 14:
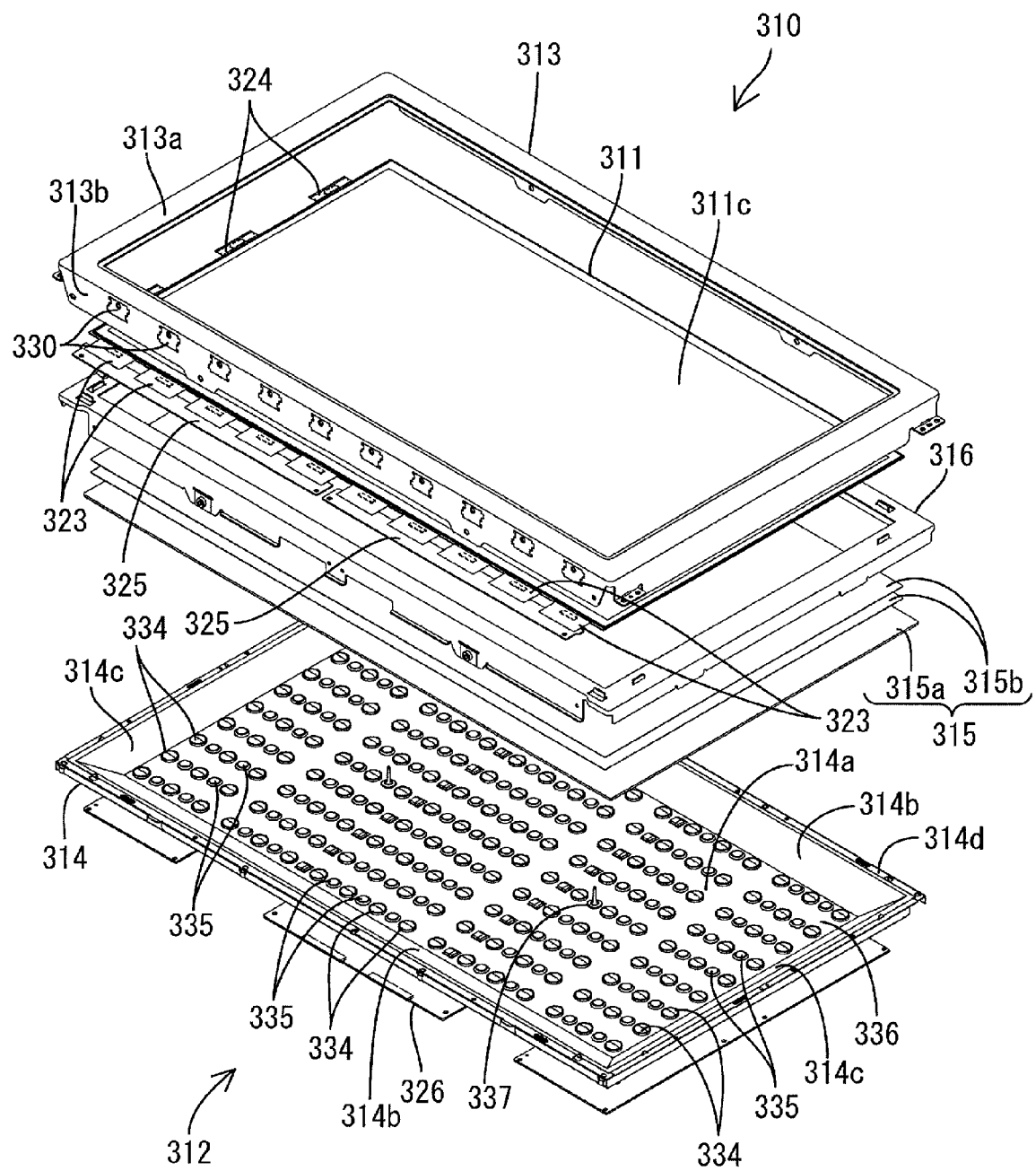
FIG. 14 is an exploded perspective view of a liquid crystal display device 310 according to a fourth embodiment.

A fourth embodiment will be described with reference to the drawings. The fourth embodiment includes a liquid crystal display device 310 including a backlight unit 312 that is a different type from those of the first to the third embodiments. Other configurations are similar to the first embodiment. Similar configurations, operations, and effects to the first embodiment will not be described. As illustrated in FIG. 14, the liquid crystal display device 310 according to the fourth embodiment includes the backlight unit 312 that does not include a light guide plate. The backlight unit 312 is a so-called direct backlight that directly provides a liquid crystal panel 311 with light from the back side of the liquid crystal panel 311. The configurations of the liquid crystal display device 310 except for the backlight unit 312 are similar to the first embodiment. In FIG. 14, portions indicated by numerals including the reference numerals in FIG. 2 with 300 added thereto have the same configurations as the portions indicated by the respective reference numerals in the first embodiment. Components having different configurations from those of the first embodiment will be described.

An optical member 315 includes a diffuser plate 315a and an optical sheet 315b. The diffuser plate 315a is arranged on the rear side (an LED 314 side, a side opposite from the light exit side). The optical sheet 315b is arranged on the front side (a liquid crystal panel 311 side, the light exit side). The diffuser sheet 315a includes a base member and diffuser particles dispersed within the base member. The base member is made of opalescent resin and has a plate-like shape with a predetermined thickness. The diffuser plate 315a is configured to diffuse light that travels therethrough. The optical sheet 315b has a sheet-like shape with a thickness smaller than the thickness of the diffuser plate 315a. The optical sheet 315b includes two sheets that are layered. Examples of sheets of the optical sheet 315b include a diffuser sheet, a lens sheet, and a reflection-type polarizing sheet. The sheets may be selected from those as appropriate. The number of or the kinds of the sheets used in the optical sheet 315b may be altered from those in the above configuration as appropriate.

A chassis 314 is made of metal. As illustrated in FIGS. 8 to 10, the chassis 314 includes a bottom plate 314a (an example of a plate-like portion), side plates 314b, side plates 314c, receiving plates 314d, and plate-like portions 314e. The bottom plate 314a has a horizontally-long rectangular shape similar to the liquid crystal panel 311. The side plates 314b project from long edges of the bottom plate 314a, that is, outer edges of the bottom plate 314a toward the front (the light exit side), respectively. The side plates 314c project from short edges of the bottom plate 314a, that is, outer edges of the bottom plate 314a toward the front (the light exit side), respectively. The receiving plates 314d project outward from distal ends of the side plates 314b, 314c, respectively. The plate-like portions 314e project from distal ends of the receiving plates 314d toward the rear. An overall shape of the chassis 314 is a shallow box-like shape (a shallow tray-like shape) that opens toward the front. A long-side direction and a short-side direction of the chassis 314 correspond to the X-axis direction (the horizontal direction) and the Y-axis direction (the vertical direction), respectively. Extending portions 336c of a reflection sheet 336, which will be described next, are sandwiched between the respective receiving plates 314d and a frame 316.

As illustrated in FIG. 14, the reflection sheet 336 has a size sufficient to cover about an entire area of inner surface of the chassis 314. The reflection sheet 336 collectively covers all LED boards 316 arranged parallel to one another inside the chassis 314 from the front side. With the reflection sheet 336, rays of light inside the chassis 314 are effectively directed toward the optical member 315. The reflection sheet 320 includes a bottom portion 336a, four rising portions 336b, and extending portions 336c. The bottom portion 336a extends along the bottom plate 314a of the chassis 314 and covers a large portion of the bottom plate 314a. The rising portions 336b project from outer edges of the bottom portion 320a toward the front at an angle relative to the bottom portion 320a. The extending portions 336c extend outward from outer edges of the rising portions 336b, respectively. The extending portions 336c are placed on the respective receiving plates 314 of the chassis 314.

An LED board 318 includes a base member having a horizontally-long rectangular shape in a plan view. The LED board 318 is held inside the chassis 314 such that the LED board 318 extends along the bottom plate 314a with a long-side direction and a short-side direction of the base member of the LED board 318 corresponding to the X-axis direction and the Y-axis direction, respectively. LEDs 317 are surface mounted on one of plate surfaces of the base member of the LED board 318 facing the front (a surface facing the optical member 315). Each of the surface mounted LEDs 317 has a light emitting surface facing the optical member 315 (or the liquid crystal panel 311) and an optical axis aligned with the Z-axis direction, that is, a direction perpendicular to a display surface of the liquid crystal panel 311. On the LED board 318, the LEDs 317 are linearly arranged along the long-side direction (the X-axis direction) of the LED board 318 and traces are formed and connected to the arranged LEDs 317 (not illustrated). The LEDs 317 are arranged with a constant pitch, that is, the LEDs 317 are arranged at about equal intervals with respect to the X-axis direction. Diffuser lenses 334 are arranged in front of the LEDs 317, respectively. Each diffuser lens 334 has a predetermined thickness and a round shape in a plan view. The diffuser lenses 334 are mounted to the LED board 318 so as to cover the respective LEDs 317 from the front, that is, so as to overlap the respective LEDs 317 in a plan view.

Next, first board holding members 335 and second board holding members 337 will be described. Each of the first board holding members 335 and the second board holding members 337 is made of synthetic resin such as polycarbonate and a white surface having high light reflectivity. As illustrated in FIG. 8, each first board holding member 335 has a round plate-like shape in a plan view from the front and holds at least the LED board 318 between the bottom plate 314a of the chassis 314 and the first board holding member 335. According to this configuration, the first board holding members 335 hold the LED board 318. As illustrated in FIG. 14, each second board holding member 337 includes a component having similar shape and configuration to those of the first board holding members 337 and a pin projecting from the component toward the front. According to this configuration, the second board holding members 337 support the optical member 315 (specifically the diffuser plate 315a) from the rear.

Figure 15:
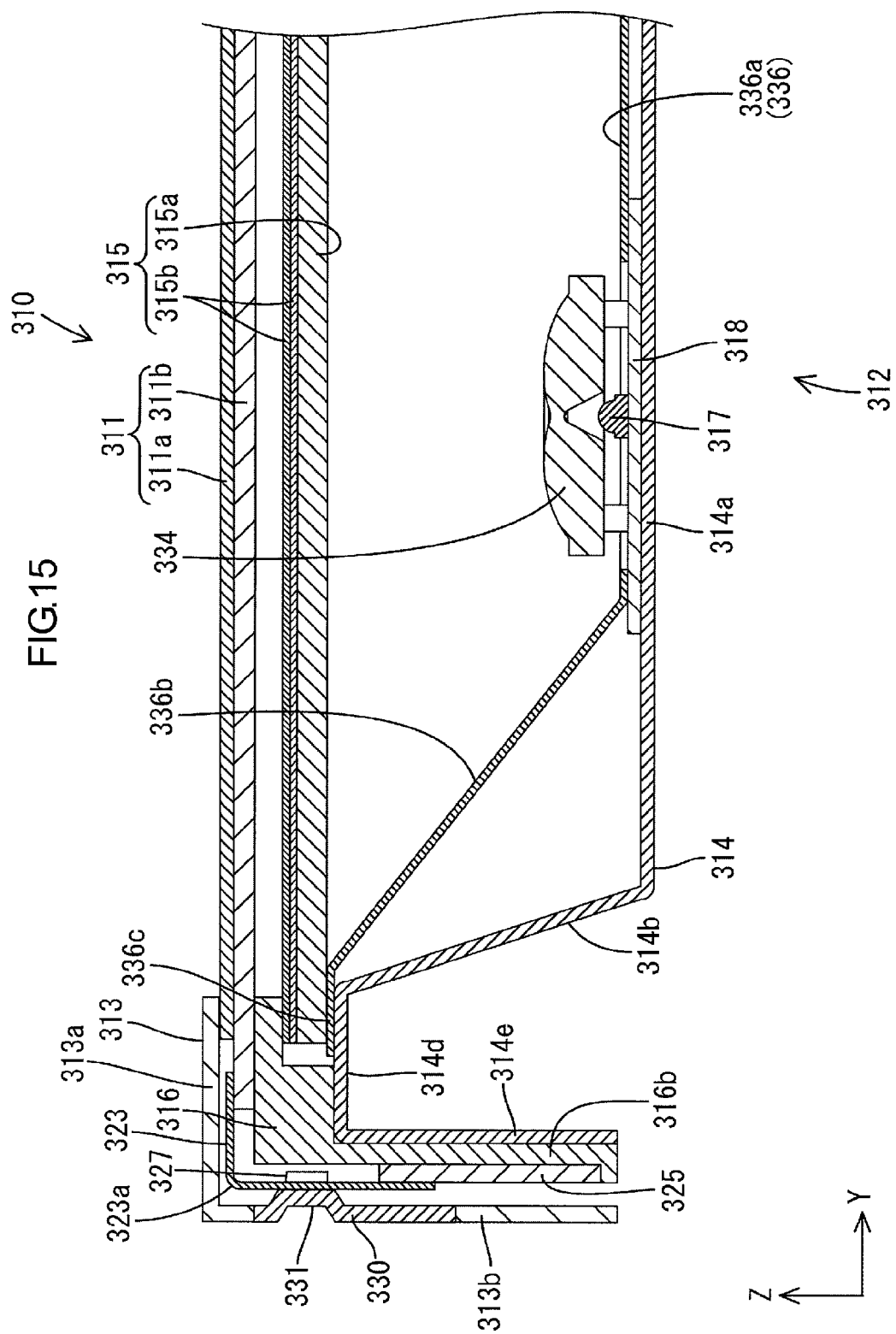
FIG. 15 is a cross-sectional view of the liquid crystal display device 310 along the short-side direction.

As illustrated in FIGS. 14 and 15, this embodiment includes heat dissipation members 330 that are arranged separately from one another along the X-axis direction in a bezel tubular portion 313b of a bezel 313 similar to the first embodiment. A shape and a configuration of each heat dissipation member 330 and how it is embedded are similar to those of the first embodiment. Although the backlight unit 312 is a direct backlight, the configuration of the heat dissipation members 330 and how contact portions contact source flexible circuit boards 323 are similar to those of the first embodiment. Therefore, heat produced by source drivers 327 is effectively dissipated via the heat dissipation members 330.

Modifications of the above embodiments will be described below.

(1) The configuration and the arrangement of the heat dissipation members and how they are embedded in the portions of the bezels may be altered from those in the above embodiments as appropriate. For example, the heat dissipation members may be embedded in portions of the bezel by welding.

(2) The shape and the arrangement of the contact portions of the heat dissipation members and how they contact the source flexible circuit boards may be altered from the those in the above embodiments as appropriate.

(3) The materials of the bezel and the heat dissipation members may be altered from those of the above embodiments as appropriate.

(4) In each of the above embodiments, the liquid crystal display device including the liquid crystal panel as the display panel is used. However, the aspect of this invention can be applied to display devices including other types of display panels.

(5) In each of the above embodiments, the television device including the tuner is used. However, the present invention can be applied to display devices without tuners.

The embodiments have been described in detail. However, the above embodiments are only some examples and do not limit the scope of the claimed invention. The technical scope of the claimed invention includes various modifications of the above embodiments.

The technical elements described in this specification and the drawings may be used independently or in combination to achieve the technical benefits. The combinations are not limited to those in original claims. With the technologies described in this specification and the drawings, multiple objects may be accomplished at the same time. However, the technical benefits can be achieved by accomplishing even only one of the objects.

EXPLANATION OF SYMBOLS

TV: television device, Ca, Cb: Cabinet, T: Tuner, S: Stand, 10, 110, 210, 310: liquid crystal display device, 11, 111, 211, 311: liquid crystal panel, 12, 112, 212, 312: backlight device, 13, 113, 213, 313: bezel, 13a, 113a, 213a, 313a: bezel frame portion, 13b, 113b, 213b, 313b: bezel tubular portion, 13c, 113c, 213c, 313c: embedding hole, 14, 114, 214, 314: chassis, 15, 115, 215, 315: optical member, 16, 116, 216, 316: frame, 17, 117, 217, 317: LED, 18, 118, 218, 318: LED board, 19, 119, 219: light guide plate, 22, 122, 222, 322: reflection sheet, 23, 123, 323: source flexible circuit board, 27, 127, 327: source driver, 30, 130, 230, 330: heat dissipation member, 31, 131, 231, 331: contact portion

The invention claimed is:

1. A display device comprising:
    a display panel;
    a flexible circuit board having flexibility and including an end connected to the display panel;
    a signal transmission board connected to another end of the flexible circuit board and configured to transmit signals to the flexible circuit board;
    a driver component mounted on the flexible circuit board and configured to process the signals from the signal transmission board and supply the processed signals to the display panel to drive the display panel;
    a frame-shaped member having a frame-like shape and retaining the liquid crystal panel by holding edges of the display panel on a display surface side; and
    a heat dissipation member having higher thermal conductivity than the frame-shaped member and embedded in a portion of the frame-shaped member, the heat dissipation member including a contact portion projecting toward the signal transmission board and a distal end being in contact with a portion of the flexible circuit board on which the driver component is mounted; wherein
    the frame-shaped member includes a top section parallel to a display surface of the display panel and a side section extending from an outer edge of the top section so as not to be parallel to the top section; and
    the heat dissipation member has a thickness equal or substantially equal to a thickness of the side section of the frame-shaped member.

2. The display device according to claim 1, wherein the heat dissipation member includes a portion including the contact portion is embedded in a portion of the side section.

3. The display device according to claim 1, wherein the frame-shaped member includes an embedding hole having a shape corresponding to an outline of the heat dissipation member and in which the heat dissipation member is fitted.

4. The display device according to claim 1, wherein the heat dissipation member is embedded in the frame-shaped member with an edge portion of the heat dissipation member engaged with the portion of the frame-shaped member.

5. The display device according to claim 1, wherein the heat dissipation member is embedded in the frame-shaped member through press-fitting of the heat dissipation member in the portion of the frame-shaped member.

6. The display device according to claim 1, wherein the heat dissipation member is embedded in the frame-shaped member through swaging of the heat dissipation member to the portion of the frame-shaped member.

7. The display device according to claim 1, wherein
    the flexible circuit board includes a plurality of flexible boards arranged parallel to and separately from one another and connected to the display panel and the signal transmission board, and
    the heat dissipation member includes a plurality of heat dissipation members embedded in portions of the frame-shaped member corresponding to the flexible circuit boards.

8. The display device according to claim 1, wherein
    the signal transmission board is arranged such that a plate surface thereof is perpendicular to the display surface of the display panel, and
    the flexible circuit board includes a bending portion that bends at about a right angle.

9. The display device according to claim 8, further comprising a lighting device arranged on an opposite side of the display panel from the display surface and configured to supply illumination light to the display panel, wherein the lighting device includes:
    a light source;
    a light guide plate including an opposed surface that is opposed to the light source and a non-opposed surface that is not opposed to the light source, the light guide plate being configured to direct light from the light source toward the display panel; and
    a chassis holding at least the light source and the light guide plate, and
    wherein the signal transmission board is arranged parallel to the non-opposed surface such that at least the chassis is between the signal transmission board and the non-opposed surface.

10. The display device according to claim 8, further comprising a panel receiving member having a frame-like shape and receiving the display panel by holding edges of an opposite surface of the display panel from the display surface,
    wherein the signal transmission board is mounted to the panel receiving member.

11. The display device according to claim 1, wherein the flexible circuit board includes a surface on which the driver component is mounted and in contact with the display panel and the signal transmission board.

12. The display device according to claim 1, wherein
    the frame-shaped member is made of stainless steel, and
    the contact portion is made of aluminum.

13. The display device according to claim 1, wherein the display panel is a liquid crystal panel including liquid crystals.

14. A television device comprising the display device according to claim 1.

* * * * *